United States Patent
Clark et al.

(10) Patent No.: US 9,780,788 B2
(45) Date of Patent: Oct. 3, 2017

(54) MULLER C-ELEMENT AS MAJORITY GATE FOR SELF-CORRECTING TRIPLE MODULAR REDUNDANT LOGIC WITH LOW-OVERHEAD MODES

(71) Applicants: Lawrence T. Clark, Phoenix, AZ (US); Srivatsan Chellappa, Tempe, AZ (US); Vinay Vashishtha, Tempe, AZ (US); Aditya Gujja, Tempe, AZ (US)

(72) Inventors: Lawrence T. Clark, Phoenix, AZ (US); Srivatsan Chellappa, Tempe, AZ (US); Vinay Vashishtha, Tempe, AZ (US); Aditya Gujja, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/332,593

(22) Filed: Oct. 24, 2016

(65) Prior Publication Data

US 2017/0117895 A1 Apr. 27, 2017

Related U.S. Application Data

(60) Provisional application No. 62/245,572, filed on Oct. 23, 2015.

(51) Int. Cl.
*H03K 19/003* (2006.01)
*H03K 19/096* (2006.01)
*H03K 3/037* (2006.01)

(52) U.S. Cl.
CPC ..... *H03K 19/00392* (2013.01); *H03K 3/0375* (2013.01); *H03K 19/0963* (2013.01)

(58) Field of Classification Search
None
See application file for complete search history.

(56) References Cited

U.S. PATENT DOCUMENTS 6,646,464 B2 * 11/2003 Maruyama ........... H03K 3/0375
326/35
7,321,989 B2 1/2008 Grayver
(Continued)

OTHER PUBLICATIONS

Author Unknown, "Announcing the Advanced Encryption Standard (AES)," Federal Information Processing Standards Publication 197, Nov. 26, 2001, National Institute of Standards and Technology, 51 pages.
(Continued)

*Primary Examiner* — Jany Richardson
(74) *Attorney, Agent, or Firm* — Withrow & Terranova, P.L.L.C.

(57) ABSTRACT

Embodiments of an sequential state element (SSE) capable of providing triple modular redundant (TMR) correction is disclosed. The SSE has a setup stage and a feedback stage. The setup stage is configured to generate an output bit signal having an output bit state while a clock signal is in the first clock state. The setup stage also generates a feedback input bit signal as feedback of the output bit state. However, the feedback stage is capable of providing TMR correction without this feedback signal. Instead, the feedback stage utilizes the second feedback input bit signal and a third feedback input bit signal from two other SSEs. Since TMR correction can be provided with just the second feedback input bit signal and the third feedback input bit signal, the power and area consumed by the SSE is reduced.

21 Claims, 10 Drawing Sheets

(56) References Cited

U.S. PATENT DOCUMENTS

| | | | |
|---|---|---|---|
| 8,161,367 B2* | 4/2012 | Chandra | H03K 19/00392 326/9 |
| 2006/0050550 A1* | 3/2006 | Petersen | G11C 11/4125 365/154 |
| 2012/0229187 A1* | 9/2012 | Choudhury | G11C 11/4125 327/202 |

OTHER PUBLICATIONS

Hindman, Nathan, et al., "Fully Automated, Testable Design of Fine-Grained Triple Mode Redundant Logic," IEEE Transactions on Nuclear Science, vol. 58, Issue 6, Dec. 2011, IEEE, pp. 3046-3052.

Katsarou, K., et al., "Soft error interception latch: double node charge sharing SEU tolerant design," Electronics Letters, vol. 51, Issue 4, Feb. 2015, pp. 330-332.

Mathew, J., et al., "On the Design of Different Concurrent EDC Schemes for S-Box and GF(p)," 11th International Symposium on Quality Electronic Design, Mar. 2010, pp. 211-218.

Mavis, David, et al., "Soft Error Rate Mitigation Techniques for Modem Microcircuits," 40th Annual Reliability Physics Symposium Proceedings, Apr. 7-11, 2002, IEEE, pp. 217-225.

Niaseer, Riaz, et al., "DF-DICE: A Scalable Solution for Soft Error Tolerant Circuit Design," International Symposium on Circuits and Systems, May 21-24, 2006, IEEE, pp. 3890-3893.

Quinn, Heather, et al., "A Review of Xilinx FPGA Architectural Reliability Concerns from Virtex to Virtex-5," 9th European Conference on Radiation and Its Effects on Components and Systems, Sep. 2007, 8 pages.

Ramamurthy, Chandarasekaran, et al., "Physical Design Methodologies for Soft Error Mitigation Using Redundancy," 15th European Conference on Radiation and Its Effects on Components and Systems, Sep. 14-18, 2015, IEEE, 5 pages.

* cited by examiner

MULLER C-ELEMENT AS MAJORITY GATE FOR SELF-CORRECTING TRIPLE MODULAR REDUNDANT LOGIC WITH LOW-OVERHEAD MODES

RELATED APPLICATIONS

This application claims the benefit of provisional patent application Ser. No. 62/245,572, filed Oct. 23, 2015, the disclosure of which is hereby incorporated herein by reference in its entirety.

FIELD OF THE DISCLOSURE

This disclosure relates generally to sequential state elements (SSEs) utilized in pipeline circuits.

BACKGROUND

State machines built from integrated circuits on semiconductor substrates need to be hardened against radiation to prevent soft error event that occur when a radiation particle travels through the semiconductor. This is particularly true if the state machine is to operate in high radiation environments such as outer space. A radiation particle traveling through the semiconductor substrate may cause a transient voltage glitch, i.e., a single event transient (SET) or may cause a sequential state element (SSE) to store the opposite state, i.e., a single event upset (SEU).

One technique for preventing the effects of high energy radiation is to provide to build a triple modular redundant (TMR) pipeline circuit with TMR SSE. In this manner, if a radiation strike result in a soft error in one copy of the pipeline circuit, the redundant SSEs in the other two copies of the pipeline circuit can correct the soft error in the affected SSE through TMR self-correction techniques. However, the power and area impact of the TMR SSEs is substantial due to the number of components (e.g., the number of field effect transistors (FETs), needed to implement each of the redundant SSEs in the TMR SSE. Accordingly, SSE designs are needed, which allow for TMR correction while consuming as low power and area in an IC as possible.

SUMMARY

This disclosure relates to sequential state elements (SSEs) capable of providing triple modular redundant (TMR) correction. In one embodiment, an SSE has a setup stage and a feedback stage. The setup stage is configured to sample an input bit signal having an input bit state and generate an output bit signal having an output bit state while a clock signal is in a first clock state. The SSE generates a feedback input bit signal having a feedback input state provided in accordance with the output bit state of the output bit signal. Therefore the feedback input bit signal provides feedback of the output bit signal. However, to provide TMR correction, the feedback stage does not itself use the feedback input bit signal that provides feedback of the output bit signal. Instead, the feedback stage is operable to receive a second feedback input bit signal having a second feedback input state and a third feedback input bit signal having a third feedback input state. While the clock signal is in a second clock state, the feedback stage is configured to drive the output bit state of the output bit signal. The second feedback input bit signal and the third feedback input bit signal comes from two other redundant SSEs. The feedback stage is configured to set the output bit state of the output bit signal in accordance with the second feedback input state and the third feedback input state in response to the second feedback input state and the third feedback input state being the same. Accordingly, if the feedback input bit signal generated by the setup stage has a different bit state than the second feedback input bit signal and the third feedback input bit signal, then the feedback input bit state has been set incorrectly by an error in the output bit state. As such, the feedback stage will thereby correct the output bit state based on the second feedback input bit state and the third feedback input bit state. However, the feedback stage is configured to hold the output bit state in response to the second feedback input bit state and the third feedback input bit state being different. In this case if the second feedback input state and the third feedback input state are different than one of them has been set incorrectly and there is an error. The first feedback input bit signal is transmitted to the redundant SSEs so that the appropriate corrections to the stored output states can be made. Note, that to provide TMR correction, the feedback stage does not need the feedback input bit signal from the SSE that it is generated from. This allows for the feedback stage to be provided with a reduced number of circuit components and also reduces the power consumption required to operate the SSE.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
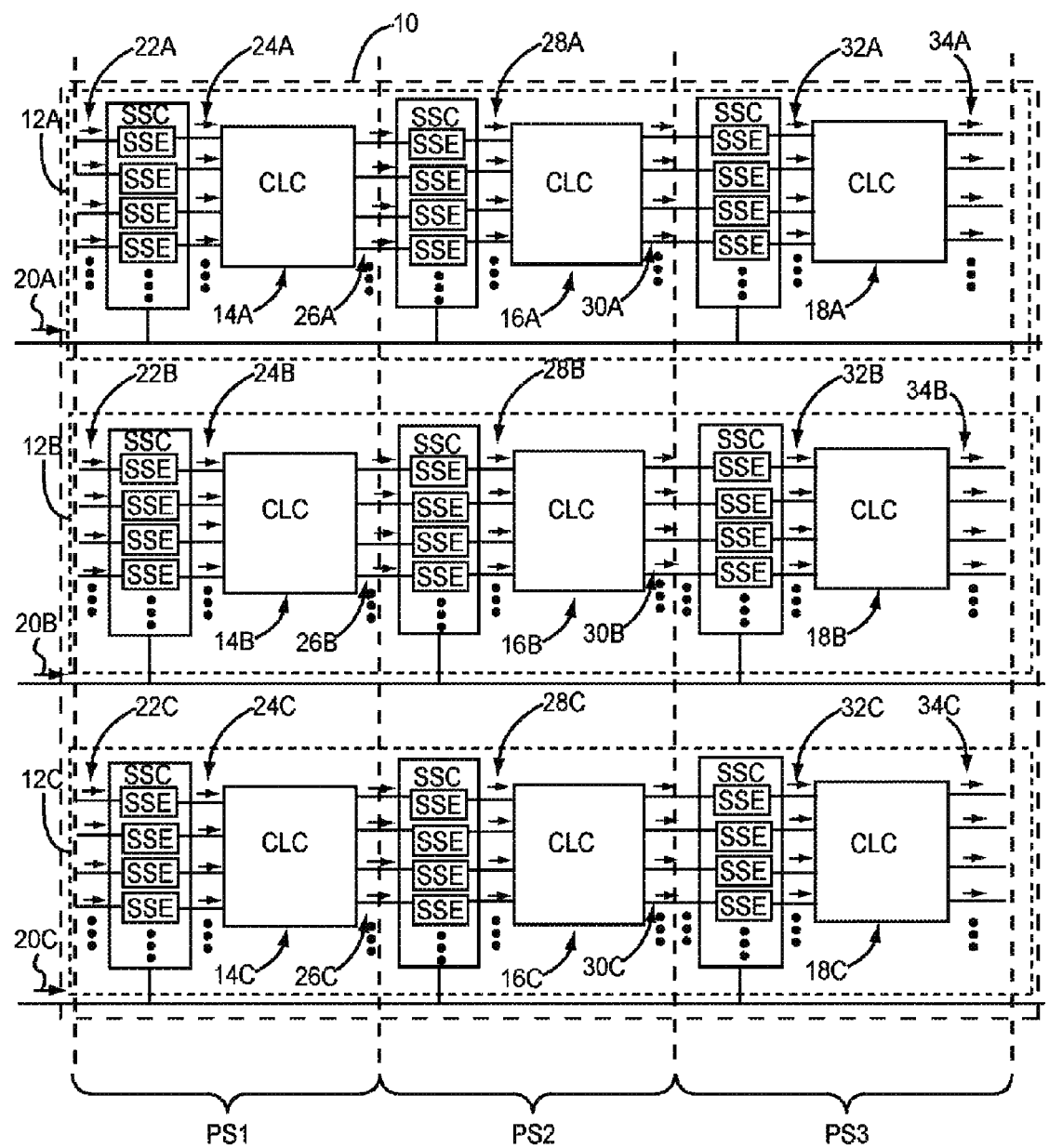
FIG. 1 illustrates one embodiment of a triple modular redundant state machine (TMRSM).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a block diagram of one embodiment of a triple-modular redundant state machine (TMRSM) 10. In the TMRSM 10, there are three redundant pipeline circuits (referred to generically with reference numeral 12 and individually as elements 12A-12C). Thus, the pipeline circuit 12A, the pipeline circuit 12B, and the pipeline circuit 12C are redundant versions of the same pipeline circuit. In the TMRSM 10, there are three redundant state machines where a first redundant state machine is provided by the pipeline circuit 12A, a second redundant state machine is provided by the pipeline circuit 12B, and a third redundant state machine is provided by the pipeline circuit 12C. Note however that, although each of the pipeline circuits 12 are redundant, the pipeline circuit 12A, and the pipeline circuit 12B, and the pipeline circuit 12C may not be exact replicas of one another. This is because one or more of the pipeline circuits 12 may or may not be logically inverted with respect to one another.

The operation of the finite state machine provided by each of the pipeline circuits 12 may be loosely analogized to an assembly line. More specifically, each of the pipeline circuits 12 has pipeline stages (referred to generically for each of the pipeline circuits as elements 14, 16, 18, and specifically for the individual pipelines as elements 14A-14C, 16A-16C, and 18A-18C). In each of the pipeline circuits 12, the different pipeline stages 14, 16, 18 handle a different operation of the finite state machine so that the various operations of the particular finite state machine are handled essentially in a series fashion. Examples of operations that may be provided by the different pipeline stages 14, 16, 18 for the particular finite state machines include instruction fetch operations, instruction decode operations, encode operations, register file operand fetch operations, instruction execution operations, data memory access operations, register file write back operations, and/or the like. Since the TMRSM 10 shown in FIG. 1 has three redundant finite state machines, the pipeline stage 14A in the pipeline circuit 12A, the pipeline stage 14B in the pipeline circuit 12B, and the pipeline stage 14C in the pipeline circuit 12C are configured to provide the same operation. The pipeline stage 16A in the pipeline circuit 12A, the pipeline stage 16B in the pipeline circuit 12B, and the pipeline stage 16C in the pipeline circuit 12C are configured to provide the same operation. The pipeline stage 18A in the pipeline circuit 12A, the pipeline stage 18B in the pipeline circuit 12B, and the pipeline stage 18C in the pipeline circuit 12C are configured to provide the same operation.

As shown in FIG. 1, the different pipeline stages 14, 16, 18 of each of the pipeline circuits 12 include combinational logic circuits (CLCs) and sequential state circuits (SSCs). In each of the pipeline circuits 12, the CLC of the different pipeline stages 14, 16, 18 is specialized to handle the particular operation of the particular pipeline stages 14, 16, 18. Accordingly, for each of the pipeline stages 14, 16, 18 in the pipeline circuits 12, the CLCs include an arrangement of combinational logic elements (i.e. logic gates) configured to provide logic that implements the operation of the pipeline stages 14, 16, 18. Both static combinational elements and/or dynamic combinational elements may be utilized. While each of the pipeline circuits 12 shown in FIG. 1 has three pipeline stages 14, 16, 18, it should be noted that alternative embodiments of the TMRSM 10 may include any number one or more of pipeline stages. This may depend on the particular finite state machine to be provided for the particular application.

To synchronize the pipeline stages 14, 16, 18 of each of the pipeline circuits 12, the sequential state circuits (SSCs) coordinate transfer of valid states between the different pipeline stages 14, 16, 18 in accordance to a clock signal (referred to generically with reference numeral 20, and individually as elements 20A-20C). The clock signal 20A received by the pipeline circuit 12A, the clock signal 20B received by the pipeline circuit 12B, and the clock signal 20C received by the pipeline circuit 12C may be the same clock signal or a different clock signal. This may depend, for example, on the particular clock distribution technique used for the TMRSM 10. It should be noted that, in this particular embodiment, each of the pipeline circuits 12 is assumed to be arranged in a single phase clock style so that each of the SSCs in the different pipeline stages 14, 16, 18 receives the same clock signal 20. Alternatively, multiple phase clock styles may be used. When multiple phase clocking styles are implemented, one or more of the SSCs in the different pipeline stages 14, 16, 18 may receive a different clock signal within each of the pipeline circuits 12. Additionally, when the CLCs are implemented using dynamic combinational elements, coordination of precharging may be coordinated by different clock signals if desired.

For each of the pipeline circuits 12, the SSC in the pipeline stage 14 receives a data input (referred to generically with reference numeral 22 and specifically with reference numerals 22A-22C). Based on the data input 22 and in accordance with the clock signal 20, the SSC in the pipeline stage 14 of each of the pipeline circuits 12 generates a data output (referred to generically with reference numeral 24 and specifically with reference numerals 24A-24C). In this embodiment, the data input 22 for each the pipeline stages 14 includes a plurality of input bit signals that provide the various bits of the data input 22. Accordingly, the data output 24 from the SSC of each of the pipeline stages 14 include a plurality of output bit signals that provide the various bits of the data output 24. Multiple sequential state elements (SSEs) are thus included in the SSC of each of the pipeline stages 14, 16, 18.

More specifically, the SSC in the pipeline stage 14A provides an SSE to receive each input bit signal in the data input 22A and generates each output bit signal in the data output 24A. The SSC in the pipeline stage 14B has an SSE to receive each input bit signal in the data input 22B and generates each output bit signal in the data output 24B. The SSC in the pipeline stage 14C has an SSE to receive each input bit signal in the data input 22C and generates each output bit signal in the data output 24C. The CLCs of each of the pipeline stages 14 perform the designated pipeline operation in accordance with their logical arrangement to generate a data input (referred to generically with reference numeral 26 and specifically with reference numerals 26A-26C) for each of the next pipeline stages 16.

It should be noted that the data inputs 22 may have any number of input bit signals depending on a data type. The data inputs 26 may also have any number of data input bit signals according to a data type. However, the data inputs 24 and the data inputs 26 may have different numbers of input bit signals since the data types of the data inputs 24 and the data inputs 26 may be different. To illustrate one non-limiting example, if the pipeline stages 14 each provide a decoding operation, the number of input bit signals in the data outputs 24 would be greater than the number of input bit signals in the data inputs 26. In another non-limiting example, if the pipeline stages 14 each provide an encoding operation, the number of input bit signals in the data inputs 24 would be less than the number of input bit signals in the data inputs 26.

For each of the pipeline circuits 12, the SSC in the pipeline stage 16 receives the data input 26 from the previous pipeline stage 14. Based on the data input 26 and in accordance with the clock signal 20, the SSC in the pipeline stage 16 of each of the pipeline circuits 12 generates a data output (referred to generically with reference numeral 28 and specifically with reference numerals 28A-28C). As mentioned above, the data input 26 for each the pipeline stages 16 includes a plurality of input bit signals that provide the various bits of the data input 26. Accordingly, the data output 28 from the SSC of each of the pipeline stages 16 includes a plurality of output bit signals that provide the various bits of the data output 28. Multiple SSEs are thus included in the SSC of each of the pipeline stages 16.

More specifically, the SSC in the pipeline stage 16A provides an SSE to receive each input bit signal in the data input 26A and generates each output bit signal in the data output 28A. The SSC in the pipeline stage 16B has an SSE to receive each input bit signal in the data input 26B and generates each output bit signal in the data output 28B. The SSC in the pipeline stage 16C has an SSE to receive each input bit signal in the data input 26C and generates each output bit signal in the data output 26C. The CLCs of each of the pipeline stages 16 perform the designated pipeline operation in accordance with their logical arrangement to generate a data input (referred to generically with reference numeral 30 and specifically with reference numerals 30A-30C) for each of the next pipeline stages 18. The data inputs 26 and the data inputs 30 may or may not have different numbers of input bit signals depending on their data types.

For each of the pipeline circuits 12, the SSC in the pipeline stage 18 receives the data input 30 from the previous pipeline stage 16. Based on the data input 30 and in accordance with the clock signal 20, the SSC in the pipeline stage 18 of each of the pipeline circuits 12 generates a data output (referred to generically with reference numeral 32 and specifically with reference numerals 32A-32C). In FIG. 1, the data input 30 for each the pipeline stages 18 includes a plurality of input bit signals that provide the various bits of the data input 30. Accordingly, the data output 32 from the SSC of each of the pipeline stages 16 includes a plurality of output bit signals that provide the various bits of the data output 32. Multiple SSEs are thus included in the SSC of each of the pipeline stages 18.

More specifically, the SSC in the pipeline stage 18A provides an SSE to receive each input bit signal in the data input 30A and to generate each output bit signal in the data output 32A. The SSC in the pipeline stage 18B has an SSE to receive each input bit signal in the data input 30B and generates each output bit signal in the data output 32B. The SSC in the pipeline stage 18C has an SSE to receive each input bit signal in the data input 30C and generates each output bit signal in the data output 32C. The CLCs of each of the pipeline stages 16 perform the designated pipeline operation in accordance with their logical arrangement to generate a data input (referred to generically with reference numeral 34 and specifically with reference numerals 34A-34C) for each of the next pipeline stages 18. The data inputs 30 and the data inputs 34 may or may not have different numbers of input bit signals depending on their data types.

As mentioned above, different embodiments of the TMRSM 10 may have any number of pipeline stages. For instance, the data inputs 34 may be transmitted externally to one or more external devices or may be provided to pipeline stages downstream from the pipeline stages 18. Similarly, the data inputs 22 for the pipeline stages 14 may be received from external devices or may be received from upstream pipeline stages. In fact, as explained below, any design for a finite state machine may be triplicated to provide a design for an embodiment of the TMRSM 10.

More specifically, in the pipeline stage 14A, the SSC has an SSE to receive each input bit signal in the data input 22A and each output bit signal in the data output 24A. In the pipeline stage 14B, the SSC has an SSE to receive each input bit signal in the data input 22B and generates each output bit signal in the data output 24B. In the pipeline stage 14C, the SSC of has an SSE to receive each input bit signal in the data input 22C and generates each output bit signal in the data output 24C. The CLCs in each of the pipeline stages 14 perform the designated pipeline operation in accordance with their logical arrangement to generate a data input (referred to generically with reference numeral 26 and specifically with reference numerals 26A-26C) for each of the next pipeline stages 16.

It should be noted that the data inputs 22 may have any number of input bit signals depending on a data type. The data inputs 26 may also have any number of data input bit signals according to a data type. However, the data inputs 24 and the data inputs 26 may have different numbers of input bit signals since the data types of the data inputs 24 and the data inputs 26 may be different. To illustrate one non-limiting example, if the pipeline stages 14 each provide a decoding operation, the number of input bit signals in the data inputs 24 would be greater than the number of input bit signals in the data inputs 26. In another non-limiting example, if the pipeline stages 14 each provide an encoding operation, the number of input bit signals in the data inputs 24 would be less than the number of input bit signals in the data inputs 26.

Figure 2:
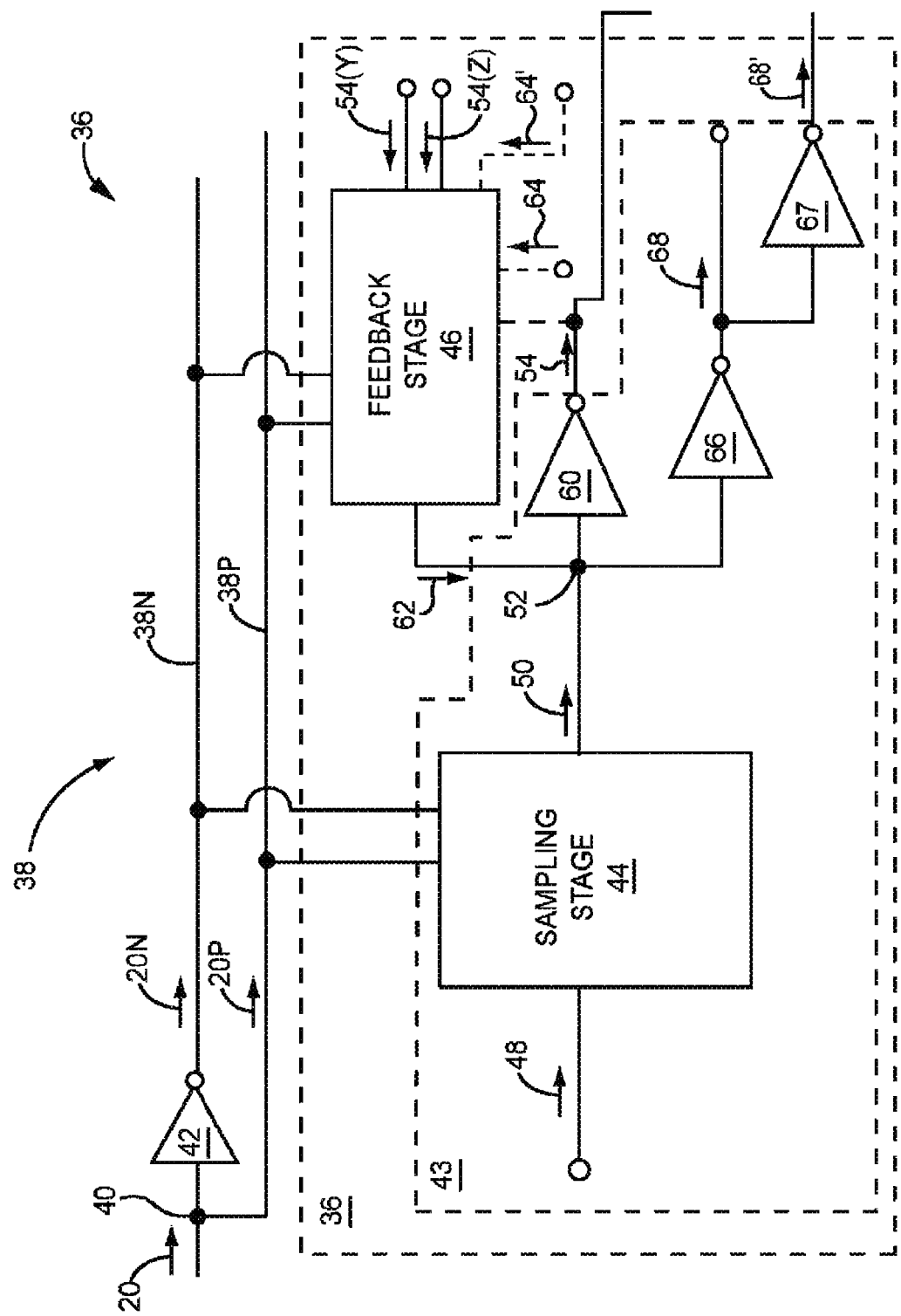
FIG. 2 illustrates one embodiment of a latch capable of providing triple modular redundant (TMR) correction, which may be provided as a sequential state element (SSE) in the TMRSM shown in FIG. 1.

Referring now to FIG. 2, FIG. 2 illustrates a block diagram of an exemplary SSE. The general purpose of SSEs is to hold bit states for processing by the CLCs while preventing subsequent bit states from entering the CLCs too soon. In FIG. 2, the SSE illustrates one embodiment of a latch 36. Embodiments of the latch 36 may be provided as one or more of the SSEs within the SSCs shown in FIG. 1. Other types of SSEs that may be provided within the SSCs include flip flops and bistables. The latch 36 shown in FIG. 2 is synchronizable in accordance with the clock signal 20, which oscillates between a first clock state and a second clock state.

The amount of time it takes the clock signal to oscillate once between the first clock state and the second clock state is generally referred to as a clock cycle. A percentage of the time during each clock cycle that the clock signal is in the first clock state versus the second clock state is referred to as the duty cycle. The latch 36 is configured to receive the clock signal 20, which coordinates the operation of the latch 36. The latch 36 may be a latch that operates with the clock signal 20 operating with a duty cycle of approximately 50% or may be a pulsed clock latch where the clock signal 20 operates with a duty cycle much greater than 50%. In this example, a clock signal path 38 is split at node 40 into two clock signal paths 38P and 38N. An inverter 42 is provided in the clock signal path 38N. The inverter 42 is operable to invert the clock signal 20 within the clock signal path 38N. No inverter has been provided in clock signal path 38P. Accordingly, the clock signal 20 is received by the latch 36 as a differential clock signal having a negative side clock signal 20N transmitted on clock path 38N, while a positive side clock signal 20P is provided in the clock signal path 38P.

The latch 36 has a setup stage 43 that includes a sampling stage 44. The latch 36 further includes a feedback stage 46 that is operably associated with the setup stage 43 to provide the latch 36. Both the sampling stage 44 and the feedback stage 46 receive the clock signal 20 (as the negative side clock signal 20N and the positive side clock signal 20P) from the clock signal path 38.

The sampling stage 44 receives an input bit signal 48 having a input bit state. While the clock signal 20 is in the first clock state, the feedback stage 46 is deactivated and the setup stage 43 is activated. As such, the sampling stage 44 is configured to sample an input bit signal 48 having an input bit state and generate an output bit signal 50 having an output bit state provided in accordance with the input bit state while the clock signal 20 is in the first clock state. Furthermore, the setup stage 43 is configured to generate a feedback input bit signal 54 having the feedback input bit state provided in accordance with the output bit state whereby the feedback input bit signal 54 is feedback of the output bit signal when the clock signal 20 is in the first clock state and in the second clock state.

In one implementation, the input bit state could be in a higher voltage state to represent a logical "1." On the other hand, the input bit state could be in a lower voltage state to represent a logical "0." While the clock signal 20 is in the first clock state, the sampling stage 44 is configured to sample the input bit signal 48 and generate an output bit signal 50 having an output bit state provided in accordance with the input bit state. In other words, the latch 36 is transparent while the clock signal 20 is in the first clock state. Depending on the embodiment of the sampling stage 44, the sampling stage 44 may be configured to generate the output bit signal 50 so that the output bit state is the same as the input bit state or inverted with respect to the input bit state. In this example, the output bit state is inverted with respect to the input bit state. While the clock signal 20 is in the first clock state, the output bit signal 50 is received at a storage node 52 with the output bit state as provided by the sampling stage 44 while the clock signal 20 is in the first clock state.

In this embodiment, the setup stage 43 includes an inverter 60. The inverter 60 is configured to receive the output bit signal 50 from the sampling stage 44. More specifically, the inverter 60 is coupled to the storage node 52 to receive the output bit signal 50. The inverter 60 generates the feedback input bit signal 54, which has a feedback input bit state that is inverted with respect to the output bit state of the output bit signal 50. Accordingly, the inverter 60 generates the feedback input bit signal 54 having a feedback bit state that is inverted with respect to the output bit state of the output bit signal 50. Accordingly, when the output bit state of the output bit signal 50 is a logical "1," the feedback bit state of the feedback input bit signal 54 is a logical "0." In contrast, when the output bit state of the output bit signal 50 is a logical "0," the feedback bit state of the feedback input bit signal 54 is a logical "1."

Thus, once the clock signal 20 switches to the second clock state, the feedback stage 46 is activated and the latch 36 is closed. In other words, the sampling stage 44 is deactivated and the latch 36 becomes opaque. Thus, changes in the input bit state do not affect the output bit state of the output bit signal 50. The feedback stage 46 is configured to drive the output bit state of the output bit signal 50 while the clock signal 20 is in the second clock state, as explained below. The feedback stage 46 ensures that the output bit state of the output bit signal 50 is maintained as provided from the sampling stage 43 while the sampling stage 43 was transparent during the first clock state of the clock signal 20. For example, if the sampling stage 44 generated the output bit signal 50 so that the output bit state of the output bit signal 50 represents a logical "1," the feedback stage 46 drives the output bit signal 50 at the storage node 52 to maintain the output bit signal 50 as representing a logical "1." On the other hand, if the output bit state was provided from the sampling stage 44 to represent a logical "0," the feedback stage 46 drives the output bit signal 50 at the storage node 52 to maintain the output bit signal 50 as representing a logical "0."

Therefore, when the latch 36 is opaque, the feedback stage 46 is configured to drive the output bit state of the output bit signal 50 at the storage node 52 while the clock signal 20 is in the second clock state. To do this, the feedback stage 46 is configured to provide triple modular redundant (TMR) correction by operating with two redundant SSEs within the same pipeline stage (e.g., either pipeline stage 14, 16, 18 of FIG. 1) but within the SSCs of two other redundant pipeline circuits 12 (See FIG. 1). The two other redundant SSEs may have feedback stages that are the same as the feedback stage 46 and operate to generate a feedback input bit signal 54(Y) based on a redundant output bit signal from one of the redundant SSE, and a feedback input bit signal 54(Z) based on another redundant output bit signal from of the remaining redundant SSE.

In effect, the combined operation of the feedback stage 46 of latch 36 and the feedback stages of the two other redundant SSE result in the output bit state of the output bit signal 50 and the output bit states of the two redundant output bit signal in the two other redundant SSEs to be driven in accordance to a majority bit state of the feedback input bit state of the feedback input bit signal 54, the feedback input bit state of the feedback input bit signal of the feedback input bit signal 54(Y), and the feedback input bit state of the feedback input bit signal the feedback input bit signal 54(Z), as explained in further detail below. The feedback input bit signal 54 is feedback of the output bit signal 50 at the storage node 52. Accordingly, the feedback input bit signal 54 has a feedback bit state that is set in accordance with the output bit state of the output bit signal 50 at the storage node 52. Also, the feedback input bit signal 54(Y) is feedback of a redundant output bit signal from one of the redundant SSEs. Accordingly, the feedback input bit signal 54(Y) has the feedback bit state that is set in accordance with the output bit state of the redundant output bit signal of that redundant SSE. Finally, the feedback input bit signal 54(Z) is feedback of a redundant output bit signal from the other one of the redundant SSEs. Accordingly, the feedback input bit signal 54(Z) has the feedback bit state that is set in accordance with the output bit state of the other redundant output bit signal of the other redundant SSE. Nevertheless, as explained in further detail below, the feedback stage 46 provides TMR correction while ignoring the feedback input bit signal 54 that the feedback stage 46 generated. This allows for a reduction in the size and the number of components in the feedback stage 46.

The feedback stage 46 is operable to receive the feedback input bit signal 54(Y) and receive the feedback input bit signal 54(Z) having a feedback input bit state. The feedback stage 46 is configured to drive the output bit state of the output bit signal 50 while the clock signal 20 is in the second clock state and thus while the latch 36 is opaque. More specifically, while the clock signal 20 is in the second clock state and the feedback stage 46 is active, the feedback stage 46 is configured to set the output bit state in accordance with the feedback input bit state in response to the feedback input bit state of the feedback input bit signal 54(Y) and the feedback input bit state of the feedback input bit signal 54(Z) being the same. Thus, when the feedback input bit state of the feedback input bit signal 54(Y) and the feedback input bit state of the feedback input bit signal 54(Z) are the same, the redundant output bit signals from the two redundant SSEs are assumed to be correct and thus the output bit state of the output bit signal 50 is driven to this correct bit state. Thus, if the output bit state of the output bit signal 50 is upset by an SEU or a SET, the feedback stage 46 will drive the output bit state of the output bit signal 50 to the correct bit state.

In this embodiment, the feedback stage 46 is configured to set the output bit state of the output bit signal 50 so that the output bit state of the output bit signal 50 is inverted with respect to the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. Thus, if the feedback input bit state of the feedback input bit signal 54(Y) and the feedback input bit state of the feedback input bit signal 54(Z) are a logical "1," the feedback stage 46 is configured to set the output bit state of the output bit signal 50 to a logical "0." In contrast, if the feedback input bit state of the feedback input bit signal 54(Y) and the feedback input bit state of the feedback input bit signal 54(Z) are a logical "0," the feedback stage 46 is configured to set the output bit state of the output bit signal 50 to a logical "1."

However, the feedback stage 46 is configured to hold the output bit state of the output bit signal 50 in response to the feedback input bit state of the feedback input bit signal 54(Y) and the feedback input bit state of the feedback input bit signal 54(Z) being the different. Thus, if the feedback input bit state of the feedback input bit signal 54(Y) and the feedback input bit state of the feedback input bit signal 54(Z) are a logical "0" and a logical "1," the feedback stage 46 is configured to hold the output bit state of the output bit signal 50 so that the output bit state is not changed. Accordingly, if the output bit state was a logical "1," the feedback stage 46 maintains the output bit state as a logical "1." In contrast, if the output bit state was a logical "0," the feedback stage 46 maintains the output bit state as a logical "0." Accordingly, if the feedback input bit state of the feedback input bit signal 54(Y) and the feedback input bit state of the feedback input bit signal 54(Z) are different, then the feedback input bit state of the feedback input bit signal 54 is the same as one and different than another one of the feedback input bit states of the feedback input bit signals 54(Y), 54(Z). As such, an error is presumed in one of the output bit state of the redundant output bit signals that produced one of the feedback input bit states of the feedback input bit signals 54(Y) and 54(Z). As such, the feedback stage 46 holds and does not change the output bit state of output bit signal 50. The feedback input bit signal 54 is routed to the redundant feedback stages of the redundant SSEs. In this manner, the feedback input bit signal 54 is used by the redundant feedback stage of the redundant SSE to provide TMR correction and correct the error in its redundant output bit state. Therefore, the feedback stage 46 is configured to drive the output bit state of the output bit signal 50 independently of the feedback input bit state of the feedback input bit signal 54 in order to provide TMR correction.

In this embodiment, the feedback stage 46 is configured to generate a feedback output bit signal 62 to drive the output bit state of the output bit signal 50 while the clock signal 20 is in the second clock state. In this embodiment, while the clock signal 20 is in the second clock state and the feedback stage 46 is active, the feedback stage 46 is configured to set the feedback output bit state of the feedback output bit signal 62 in accordance with the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. More specifically, the feedback stage 46 is configured to set the feedback output bit state of the feedback output bit signal 62 so that the feedback output bit state of the output bit signal 50 is inverted with respect to the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. Further, to drive the output bit state of the output bit signal 50 while the clock signal 20 is in the second clock state, the feedback stage 46 shown in FIG. 2 is configured to hold the feedback output bit state of the feedback output bit signal 62 in response to the feedback input bit state of the feedback input bit signal 54(Y) and the feedback input bit state of the feedback input bit signal 54(Z) being different. In this manner, the feedback output bit state of the feedback output bit signal 62 is configured to drive the output bit state of the output bit signal 50, as described above.

Embodiments of the feedback stage 46 may be configured to always provide TMR correction as described above during operation or may operate in different feedback modes. Embodiments of the feedback stage 46 that always provide TMR correction may not receive the feedback input bit signal 54 or any other type of feedback of the output bit signal 50 at all, as explained below. However, as explained below, other embodiments of the feedback stage 46 may operate in several feedback modes, including a TMR feedback mode. In this case, the feedback stage 46 may be configured to receive the feedback input bit signal 54 along with a feedback mode signal 64 and a complementary feedback mode signal 64'. For example, when the feedback mode signal 64 and the complementary feedback mode signal 64' indicate the TMR correction mode, the feedback stage 46 provides TMR correction as described above. However, when the feedback mode signal 64 and the complementary feedback mode signal 64' indicate a nonredundant feedback correction mode, the feedback stage 46 may be configured to set the drive of the output bit state of the output bit signal 50 in accordance with the feedback input bit state of the feedback input bit signal 54 so that the three redundant latches operate independently as described below.

The setup stage 43 further includes an inverter 66 and an inverter 67. The inverter 66 is configured to receive the output bit signal 50 at the storage node 52 and generate a final output bit signal 68. The inverter 67 is configured to receive the final output bit signal 68 and generate a final output bit signal 68'. The final output bit signal 68 and the final output bit signal 68' are thus complementary signals and thus are inverted with respect to one another. The final output bit signal 68 may be transmitted to a CLC of one of the pipeline circuits 12 (shown in FIG. 1). Due to the inversion by the inverter 66, the final output bit state is inverted with respect to the output bit signal 50. When the sampling stage 44 is opaque, the final output bit state is isolated from changes in the input bit state of the input bit signal 48. In essence, these changes cannot enter the storage node 52 and affect the final output bit state. However, once the clock signal 20 oscillates back into the first clock state, the sampling stage 44 again becomes transparent. Thus, the input bit state of the input bit signal 48 can change the output bit state of the output bit signal 50 at the storage node 52. In this manner, valid bit states are passed according to the timing of the clock signal 20.

Figure 3:
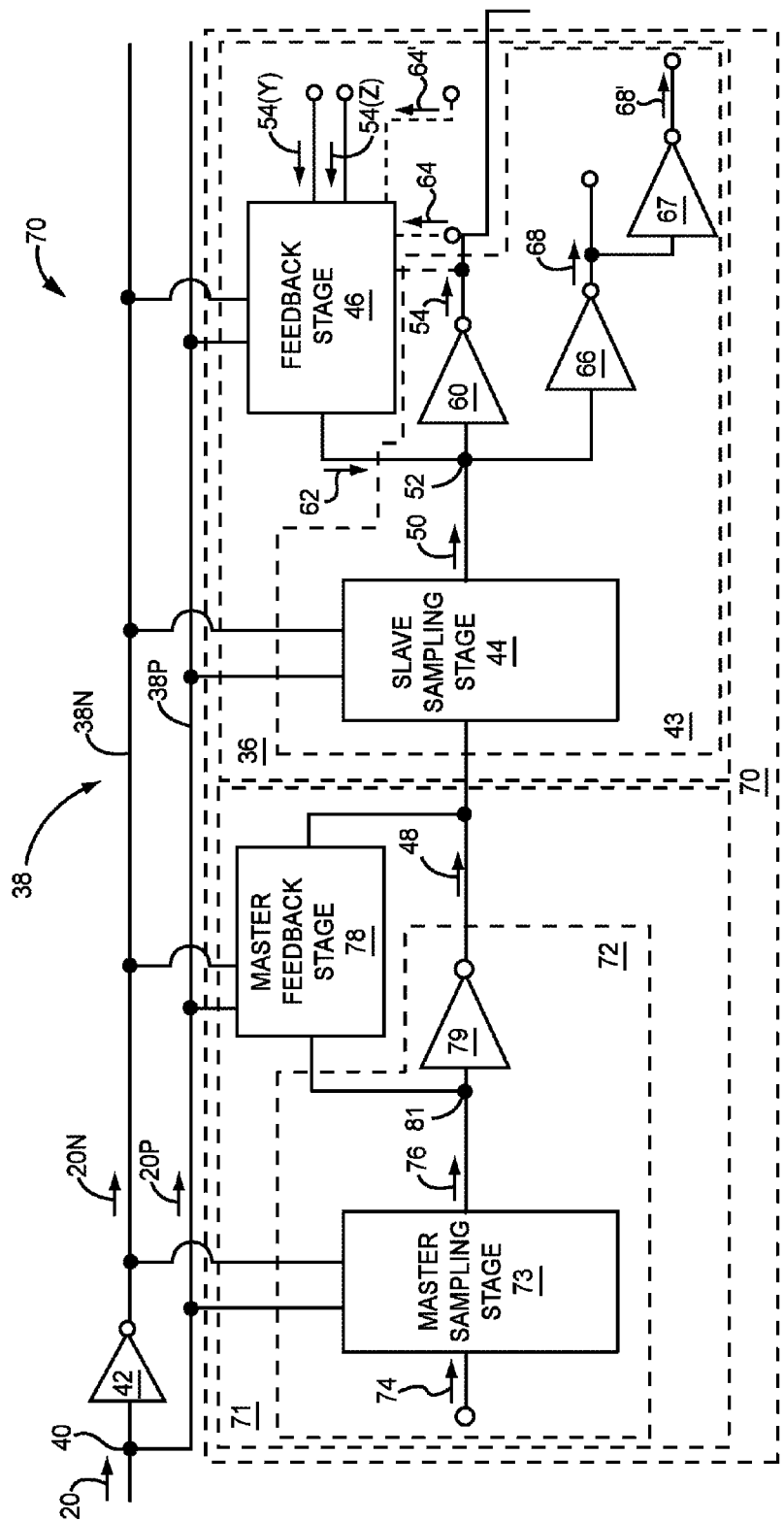
FIG. 3 illustrates an embodiment of a flip flop, which utilizes the latch shown in FIG. 2 as a slave latch.

FIG. 3 illustrates a block diagram of another exemplary SSE. In this example, the SSE shown in FIG. 3 illustrates one embodiment of a flip flop 70. The flip flop 70 has a slave latch 36, which is the same latch 36 described above in FIG. 2. The slave latch 36 comprises the setup stage 43 and the feedback stage 46 shown in FIG. 2, wherein the setup stage 43 and the feedback stage 46 are operably associated so that the setup stage 43 is a slave setup stage 43 of the slave latch 36 and so that the feedback stage 46 is a slave feedback stage 46 of the slave latch 36. The slave latch 36 operates in the same manner described above with respect to FIG. 2.

However, the flip flop 70 also includes a master latch 71. The master latch 71 is opaque while the slave latch 36 is transparent and the master latch 71 is transparent while the slave latch 36 is opaque. More specifically, the master latch 71 is opaque and the slave latch 36 is transparent while the clock signal 20 is in the first clock state and the master latch 71 is transparent and the slave latch 36 is opaque while the clock signal 20 is in the second clock state. The master latch 71 deraces the path to the slave latch 36 so that that hold time requirements for the slave latch 36 are more easily met. The master latch 71 is operably associated to the slave latch 36 so that the master latch 71 and the slave latch 36 provide the flip flop 70.

As shown in FIG. 3, the master latch 71 has a master setup stage 72 that includes a master sampling stage 73. The master sampling stage 73 is configured to sample an initial input bit signal 74 having an initial input bit state so as to generate the input bit signal 48 while the clock signal 20 is in the second clock state. To generate the input bit signal 48, the master sampling stage 73 generates the intermediary output bit signal 76. Since an intermediary output bit state of the intermediary output bit signal 76 is based on the initial input bit state, the input bit state of the input bit signal 48 is related to the intermediary output bit state of the intermediary output bit signal 76. In this embodiment, the master sampling stage 73 is configured to generate the intermediary output bit signal 76 such that the intermediary output bit state of the intermediary output bit signal 76 is inverted with respect to the initial input bit state of the input bit signal 74.

In this example, the master setup stage 72 includes an inverter 79 and a storage node 81. The inverter 79 is coupled to the storage node 81 so as to generate the input bit signal 48 from the intermediary output bit signal 76. The input bit state of the input bit signal 48 is thus inverted with respect to the intermediary output bit state of the intermediary output bit signal 76 due to the inverter 79.

The master latch 71 also includes a master feedback stage 78. The master setup stage 72 and the master feedback stage 78 are operably associated so as to provide the master latch 71. The master feedback stage 78 is operable to receive the input bit signal 48 from the inverter 79. The master feedback stage 78 is configured to drive the intermediary output bit state of the intermediary output bit signal 76 at the storage node 81 such that the intermediary output bit state of the intermediary output bit signal 76 is held at the storage node 81 in accordance with the input bit state of the input bit signal 48 while the clock signal 20 is in the first clock state. In this embodiment, the master feedback stage 78 is configured to drive the intermediary output bit state of the intermediary output bit signal 76 at the storage node 81 so that the intermediary output bit state of the intermediary output bit signal 76 is inverted with respect to the input bit state of the input bit signal 48.

Figure 4:
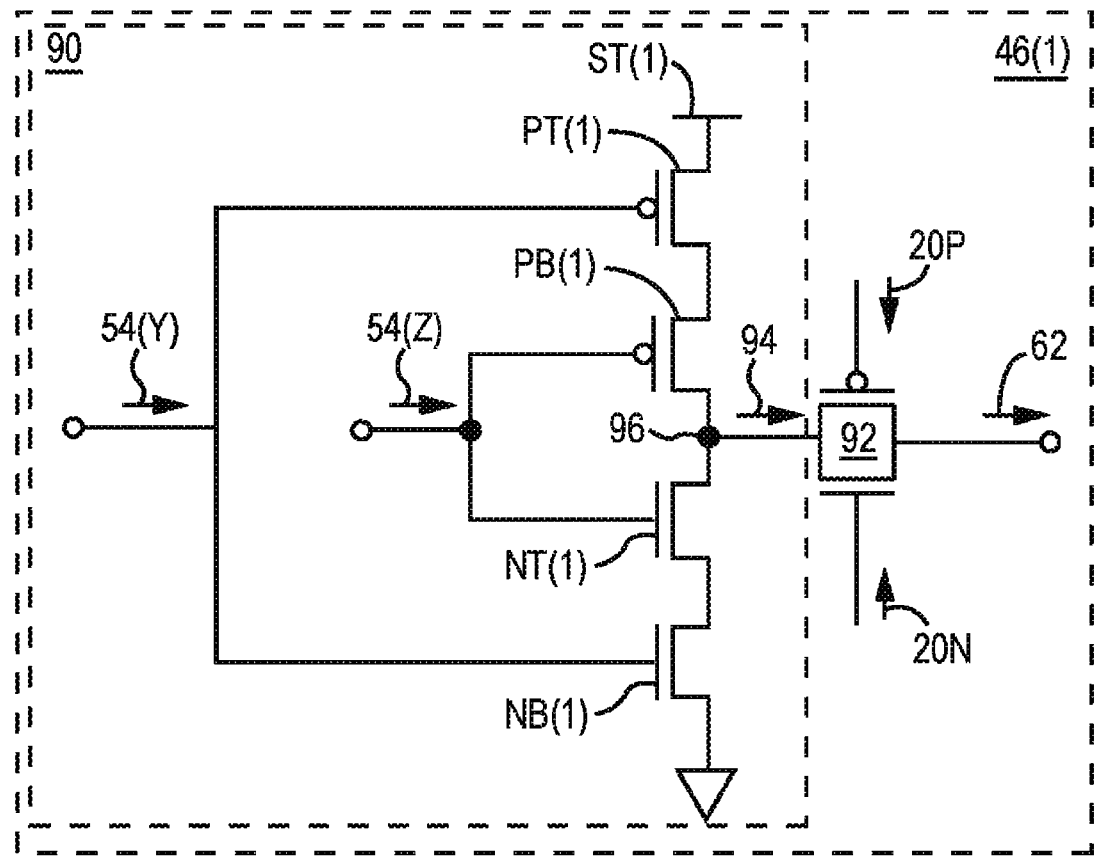
FIG. 4 illustrates one embodiment of a feedback stage that may be provided in the flip flop shown in FIG. 3 to provide TMR correction.

FIG. 4 illustrates one embodiment of a feedback stage 46(1), which is one embodiment of the feedback stage 46 shown in FIG. 3. In this example, the feedback stage 46(1) is provided as a tristate gate. The feedback stage 46(1) is configured to generate a feedback output bit signal 62 that drives the output bit state of the output bit signal 50 in accordance with the feedback output bit state of the feedback output bit signal 62 while the clock signal is in the second clock state. The feedback stage 46(1) is configured to hold the feedback output bit state in response to the feedback input bit state of the feedback input bit signal 54(Y) and the feedback input bit state of the feedback input bit signal 54(Z) being different. Furthermore, the feedback stage 46(1) is configured to set the feedback output bit state in accordance with the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. Note that the feedback stage 46(1) does not receive the feedback input bit signal 54 and thus the feedback stage 46(1) is unresponsive to the feedback input bit signal 54 and thus ignores the feedback input bit signal 54. Furthermore, the feedback stage 46(1) does not receive the feedback mode signal 64, the complementary feedback mode signal 64', or any other feedback mode signal 64, since the feedback stage 46(1) is strictly configured to provide TMR correction. In other embodiments, other components may be provided so that the feedback stage 46 provides additional feedback functionality.

To do this, the feedback stage 46(1) has a Muller C element 90 and a transmission gate 92. With regards to the Muller C element 90, the Muller C element 90 is operable to receive the feedback input bit signal 54(Y) and the feedback input bit signal 54(Z). The Muller C element 90 is also configured to generate an intermediary feedback bit signal 94 having an intermediary feedback bit state. With regards to the intermediary feedback bit state of the intermediary feedback bit signal 94, the Muller C element 90 is configured to hold the feedback output bit state in response to the feedback input bit state of the feedback input bit signal 54(Y) and the feedback input bit state of the feedback input bit signal 54(Z) being different. The Muller C element 90 is further configured to set the feedback output bit state in accordance with the feedback input bit state of the feedback input bit signal 54(Y) and the feedback input bit state of the feedback input bit signal 54(Z) in response to second feedback input bit state of the feedback input bit signal 54(Y) and the feedback input bit state of the feedback input bit signal 54(Z) being the same.

In this embodiment, the Muller C element 90 is an inverting Muller C element and thus the Muller C element 90 is configured to provide the intermediary feedback bit state of the intermediary feedback bit signal 94 such that the intermediary feedback bit state of the intermediary feedback bit signal 94 is inverted with respect to the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. The Muller C element 90 includes a pair of P channel FETs (P-channel FET PT(1), and P-channel FET PB(1)) and a pair of N channel FETs (N-channel FET NT(1), and N-channel FET NB(1)). The pair of P channel FETs (P-channel FET PT(1), and P-channel FET PB(1)) is stacked and coupled between a supply terminal ST(1) and a connection node 96. The pair of N channel FETs (N-channel FET NT(1), and N-channel FET NB(1)) is stacked and coupled between the connection node 96 and ground. A gate of one of the pair of P-channel FETs is coupled to receive the feedback input bit signal 54(Y) while a gate of the other one of the pair of P channel FETs is coupled to receive the feedback input bit signal 54(Z). Also, a gate of one of the pair of N-channel FETs is coupled to receive the feedback input bit signal 54(Y) while a gate of the other one of the pair of N-channel FETs is coupled to receive the feedback input bit signal 54(Z).

Accordingly, one of the pair of P-channel FETs is disabled and one of the pair of N-channel FETs is disabled in response to the feedback input bit state of the feedback input bit signal 54(Y) and the feedback input bit state of the feedback input bit signal 54(Z) being different. As such, charge from the supply terminal ST(1) is blocked and the charge is prevented from flowing to ground at the connection node 96. Consequently, the intermediary feedback bit state of the intermediary feedback bit signal 94 is held and does not change. The pair of P-channel FETs are enabled and the pair of N-channel FETs are disabled in response to the feedback input bit state of the feedback input bit signal 54(Y) and the feedback input bit state of the feedback input bit signal 54(Z) being low. As such, the pair of P-channel FETs pull the intermediary feedback bit state of the intermediary feedback bit signal 94 high at the connection node 96. In contrast, the pair of P-channel FETs are disabled and the pair of N-channel FETs are enabled in response to the feedback input bit state of the feedback input bit signal 54(Y) and the feedback input bit state of the feedback input bit signal 54(Z) being high. As such, the pair of N-channel FETs push the intermediary feedback bit state of the intermediary feedback bit signal 94 low at the connection node 96.

The transmission gate 92 is operable to receive the intermediary feedback bit signal 94 from the connection node 96 of the Muller C element 90 along with the positive side clock signal 20P and the negative side clock signal 20N. The transmission gate 92 is configured to generate the feedback output bit signal 62 that drives the output bit state of the feedback output bit signal 62 (shown in FIG. 2) and sample the intermediary feedback bit signal 94 while the clock signal 20 is in the second clock state (i.e., while the positive side clock signal 20P is in the second clock state and the negative side clock signal 20N is in the first clock state). As such, while the clock signal 20 is in the second clock state (i.e., while the positive side clock signal 20P is in the second clock state and the negative side clock signal 20N is in the first clock state), the transmission gate 92 is configured to sample the intermediary feedback bit signal 94 so that the feedback output bit state of the feedback output bit signal 62 is set in accordance with the intermediary feedback bit state of the intermediary feedback bit signal 94. In this example, the transmission gate 92 provides the feedback output bit state of the feedback output bit signal 62 to be the same as the intermediary feedback bit state of the intermediary feedback bit signal 94 while transparent. The transmission gate 92 is deactivated and does not generate the feedback output bit signal 62 while the clock signal 20 is in the first clock state (i.e., while the positive side clock signal 20P is in the first clock state and the negative side clock signal 20N is in the second clock state).

Figure 5:
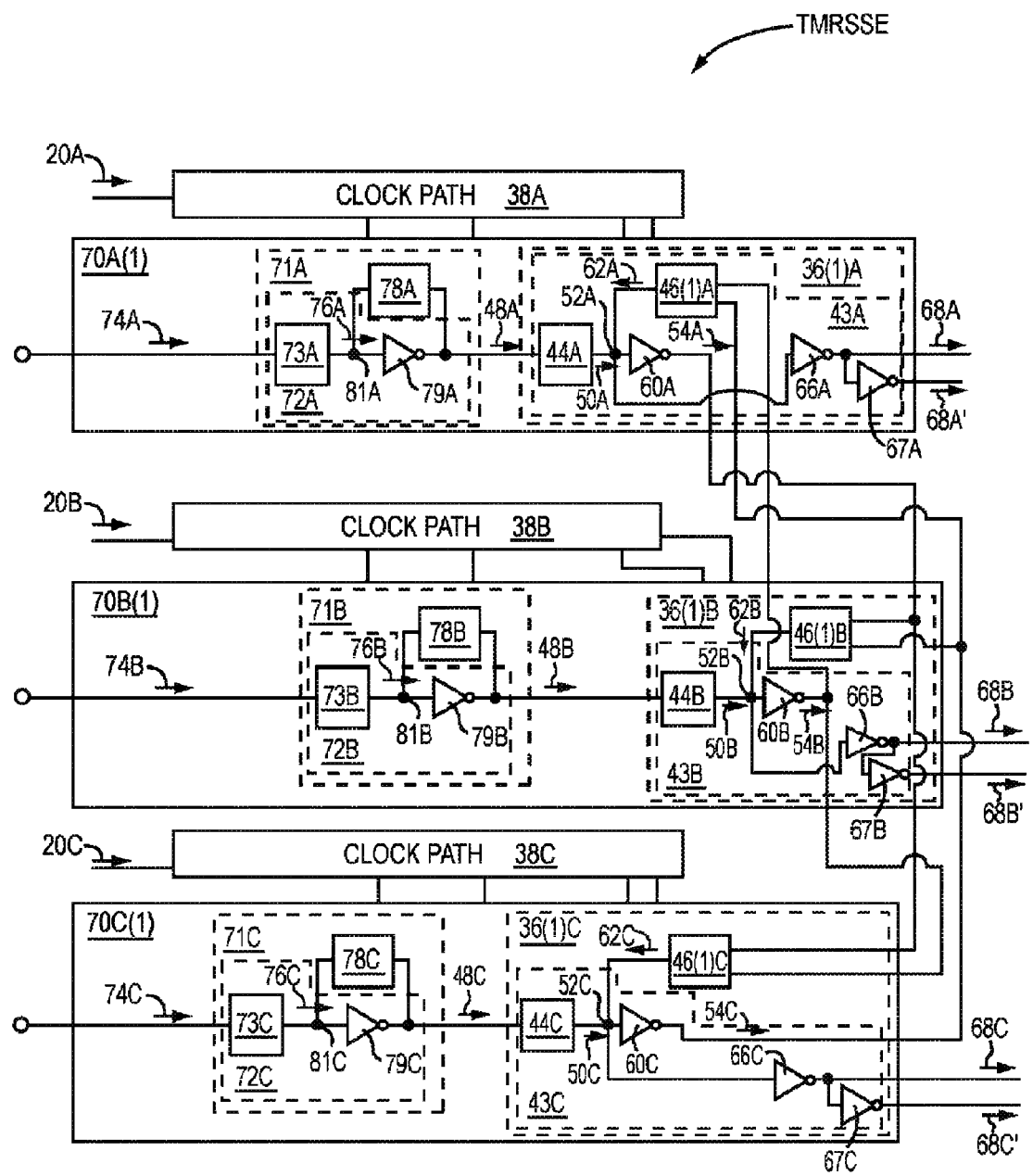
FIG. 5 illustrates one embodiment of a TMR SSE having three redundant copies of the flip flop shown in FIG. 3, where each of the feedback stages of the flip flops are provided as a copy of the feedback stage shown in FIG. 4.

FIG. 5 illustrates an embodiment of an SSE, which in this embodiment is a TMR SSE. The TMR SSE includes three flip flops 70A(1), 70B(1), and 70C(1) (referred to generically, collectively, or generally as flip flops 70(1), each are the same as the flip flop 70 shown in FIG. 2. However, each of the flip flops 70(1) has a slave feedback stage 46(1)A, 46(1)B, 46(1)C, like the feedback stage 46(1) shown in FIG. 4. Furthermore, each of the flip flops 70(1) is provided with the same pipeline stage PS (can be any one of the pipeline stage PS1, PS2, PS3 shown in FIG. 1) but in different SSCs (shown in FIG. 1) of different pipeline circuits 12 (shown in FIG. 1). For the sake of explanation, it is presumed that the flip flop 70A(1) is within the SSC (shown in FIG. 1) of one of the pipeline stage PS (shown in FIG. 1) of the pipeline circuit 12A (shown in FIG. 1). The flip flop 70B(1) is within the SSC (shown in FIG. 1) of the same pipeline stage PS (shown in FIG. 1) but within the pipeline circuit 12B (shown in FIG. 1). Finally, the flip flop 70C(1) is within the SSC (shown in FIG. 1) of the same pipeline stage PS (shown in FIG. 1) but within the pipeline circuit 12C (shown in FIG. 1).

The clock paths 38A, 38B, and 38C of the flip flops 70A(1), 70B(1), and 70C(1) are each the same as the clock path 38 shown in FIGS. 2 and 3. The clock signal 20A received by the flip flops 70A(1), the clock signal 20B received by the second flip flop 70B(1), and the clock signal 20C received by the third flip flop 70C(1) may be the same clock signal or a different clock signal. This may depend, for example, on the particular clock distribution technique. It should be noted that, in this particular embodiment, each of the pipeline circuits 12 (shown in FIG. 1) is assumed to be arranged in a single phase clock style so that each of the flip flops 70A(1), 70B(1), and 70C(1) receive the same clock signal 20. Thus, the clock signal 20A, the clock signal 20B, and the clock signal 20C are each the same clock signal 20. Alternatively, multiple phase clock styles may be used where the clock signal 20A, clock signal 20B, and clock signal 20C are different phased clock signals and the clock signal 20 is a global clock signal. Additionally, when the CLCs (shown in FIG. 1) are implemented using dynamic combinational elements, coordination of precharging may be coordinated by different clock signals if desired.

With regards to the first flip flop 70A(1), the flip flop 70A(1) includes a first master latch 71A that is the same as the master latch 71 shown in FIG. 3 and a first slave latch 36(1)A that is the same as the slave latch 36 shown in FIG. 3. The first master latch 71A and the first slave latch 36(1)A are operably associated so as to provide the first flip flop 70A(1). The first master latch 71A is opaque while the first slave latch 36(1)A is transparent and de-races the path to the first slave latch 36(1)A so that that hold time requirements for the first slave latch 36(1)A are more easily met. The master latch 71 has a first master setup stage 72A that includes a first master sampling stage 73A. The first master sampling stage 73A configured to sample a first initial input bit signal 74A having a first initial input bit state to generate the first input bit signal 48A while the clock signal 20 is in the second clock state. Thus, the first master latch 71A is transparent while the first slave latch 36(1)A is opaque. To generate the first input bit signal 48A, the first master sampling stage 73A generates the first intermediary output bit signal 76A. Since a first intermediary output bit state of the first intermediary output bit signal 76A is based on the first initial input bit state, the first input bit state of the first input bit signal 48A is related to the first intermediary output bit state of the first intermediary output bit signal 76A. In this embodiment, the first master sampling stage 73A generates the first intermediary output bit signal 76A such that the first intermediary output bit state of the intermediary output bit signal 76A is inverted with respect to the first initial input bit state of the first input bit signal 74A.

In this example, the first master setup stage 72A includes an inverter 79A and a storage node 81A. The inverter 79A is coupled to the storage node 81A so as to generate the first input bit signal 48A from the intermediary output bit signal 76A. The first input bit state of the first input bit signal 48A is thus inverted with respect to the first intermediary output bit state of the first intermediary output bit signal 76A due to the inverter 79A.

The first master latch 71A also includes a first master feedback stage 78A. The first master setup stage 72A and the first master feedback stage 78A are operably associated so as to provide the first master latch 71A. The first master feedback stage 78A is operable to receive the first input bit signal 48A from the inverter 79A. The first master feedback stage 78A is configured to drive the first intermediary output bit state of the first intermediary output bit signal 76A at the storage node 81A such that the first intermediary output bit state of the first intermediary output bit signal 76A is held at the storage node 81A in accordance with the first input bit state of the first input bit signal 48A while the clock signal 20 is in the first clock state. In this embodiment, the first master feedback stage 78A is configured to drive the first intermediary output bit state of the first intermediary output bit signal 76A at the storage node 81A so that the first intermediary output bit state of the first intermediary output bit signal 76A is inverted with respect to the first input bit state of the first input bit signal 48A.

The first slave latch 36(1)A has a first slave setup stage 43A that includes a first slave sampling stage 44A. The first slave latch 36(1)A further includes a first slave feedback stage 46(1)A that is operably associated with the first slave setup stage 43A to provide the first slave latch 36(1)A. Both the first slave sampling stage 44A and the first slave feedback stage 46(1)A receive the clock signal 20 (as the negative side clock signal 20NA and the positive side clock signal 20PA) from the first clock path 38A.

The first slave sampling stage 44A receives a first input bit signal 48A having a first input bit state. While the clock signal 20 is in the first clock state, the first slave feedback stage 46(1)A is deactivated and the first slave setup stage 43A is activated. As such, the first slave sampling stage 44A is configured to sample a first input bit signal 48A having a first input bit state and generate a first output bit signal 50A having a first output bit state provided in accordance with the first input bit state while the clock signal is in the first clock state. Furthermore, the first slave setup stage 43A is configured to generate a first feedback input bit signal 54A having a first feedback input bit state provided in accordance with the first output bit state whereby the first feedback input bit signal 54A is feedback of the first output bit signal 50A when the clock signal 20 is in the first clock state and in the second clock state.

In one implementation, the first input bit state could be in a higher voltage state to represent a logical "1." On the other hand, the first input bit state could be in a lower voltage state to represent a logical "0." While the clock signal 20 is in the first clock state, the first slave sampling stage 44A is configured to sample the first input bit signal 48A and generate a first output bit signal 50A having a first output bit state provided in accordance with the first input bit state. In other words, the first slave latch 36(1)A is transparent while the clock signal 20 is in the first clock state. Depending on the embodiment of the first slave sampling stage 44A, the first slave sampling stage 44A may be configured to generate the first output bit signal 50A so that the first output bit state is the same as the first input bit state or inverted with respect to the first input bit state. In this example, the first output bit state is inverted with respect to the first input bit state. While the clock signal 20 is in the first clock state, the first output bit signal 50A is received at a storage node 52A with the first output bit state as provided by the first slave sampling stage 44A while the clock signal 20 is in the first clock state.

In this embodiment, the first slave setup stage 43A includes an inverter 60A. The inverter 60A generates the first feedback input bit signal 54A having a first feedback bit state that is inverted with respect to the first output bit state of the first output bit signal 50A. Accordingly, when the first output bit state of the first output bit signal 50A is a logical "1", the first feedback bit state of the first feedback input bit signal 54A is a logical "0." In contrast, when the first output bit state of the first output bit signal 50A is a logical "0," the first feedback bit state of the first feedback input bit signal 54A is a logical "1." Thus, this embodiment of the first slave feedback stage 46(1)A is configured to drive the first output bit state of the first output bit signal 50A as an inverse of the first feedback input bit signal 54A, second feedback input bit signal 54B, and the third feedback input bit signal 54C.

As shown in FIG. 5, the first slave feedback stage 46(1)A is configured to generate a first feedback output bit signal 62A to drive the first output bit state of the first output bit signal 50A while the clock signal 20 is in the second clock state. In this embodiment, while the clock signal 20 is in the second clock state, the first slave feedback stage 46(1)A is active, the first slave feedback stage 46(1)A is configured to set the first feedback output bit state in accordance with the second feedback input bit state and the third feedback input bit state in response to the second feedback input bit state of the second feedback input bit signal 54B and the third feedback input bit state of the third feedback input bit signal 54C being the same. More specifically, the first slave feedback stage 46(1)A is configured to set the first feedback output bit state of the first feedback output bit signal 62A so that the first feedback output bit state of the first output bit signal 50A is inverted with respect to the second feedback input bit state of the second feedback input bit signal 54B and the third feedback input bit state of the third feedback input bit signal 54C in response to the second feedback input bit state of the second feedback input bit signal 54B and the third feedback input bit state of the third feedback input bit signal 54C being the same. Also, to drive the first output bit state of the first output bit signal 50A while the clock signal 20 is in the second clock state, the first slave feedback stage 46(1)A is configured to hold the first feedback output bit state of the first feedback output bit signal 62A in response to the second feedback input bit state and the third feedback input bit state being different. In this manner, the first feedback output bit state of the first feedback output bit signal 62A is configured to drive the first output bit state of the first output bit signal 50A, as described above. The first feedback input bit signal 54A is provided to the two other redundant latches so that they can also provide TMR correction. As such, the first slave feedback stage 46(1)A is configured to drive the first output bit state of the first output bit signal 50A independently of the first feedback input bit state of the first feedback input bit signal 54A in order to provide TMR correction.

In this embodiment, the first slave feedback stage 46(1)A is the same as the feedback stage 46(1) shown in FIG. 4 and thus always provides TMR correction. Furthermore, the first slave feedback stage 46(1)A does not receive the first feedback input bit signal 54A or any other type of feedback of the output bit signal 50A at all. Additionally, the first slave feedback stage 46(1)A does not receive the feedback mode signal 64 shown in FIG. 2 or the complementary feedback mode signal 64' shown in FIG. 2. In this example, the first feedback stage 46(1)A is provided as a first tristate gate. The first feedback stage 46(1)A is configured to generate the first feedback output bit signal 62A that drives the first output bit state of the first output bit signal 50A in accordance with the first feedback output bit state of the first feedback output bit signal 62A while the clock signal is in the second clock state. The first feedback stage 46(1)A is configured to hold the first feedback output bit state in response to the second feedback input bit state of the second feedback input bit signal 54B and the third feedback input bit state of the third feedback input bit signal 54C being different. Furthermore, the first feedback stage 46(1)A is configured to set the first feedback output bit state in accordance with the second feedback input bit state of the second feedback input bit signal 54B and the third feedback input bit state of the third feedback input bit signal 54C in response to the second feedback input bit state of the second feedback input bit signal 54B and the third feedback input bit state of the third feedback input bit signal 54C being the same. Note that the first feedback stage 46(1)A does not receive the first feedback input bit signal 54A and thus the first feedback stage 46(1)A is unresponsive to the first feedback input bit signal 54A and thus ignores the first feedback input bit signal 54A. Furthermore, the first feedback stage 46(1)A does not receive the feedback mode signal 64 (shown in FIG. 2), the complementary feedback mode signal 64' (shown in FIG. 2), or any other feedback mode signal 64, since the first feedback stage 46(1)A is strictly configured to provide TMR correction.

The first feedback stage 46(1)A thus is a tristate gate that includes a first Muller C element and a first transmission gate, just like the Muller C element 90 and the transmission gate 92 shown in FIG. 4. The first Muller C element and the first transmission gate of the feedback stage 46(1)A shown in FIG. 5 operate in the same manner as the Muller C element 90 and the transmission gate 92 shown in FIG. 4 where the feedback input bit signal 54 is the first feedback input bit signal 54A, the feedback input bit signal 54(Y) is the second feedback input bit signal 54B, and the feedback input bit signal 54(Z) is the third feedback input bit signal 54C.

The first slave setup stage 43A further includes an inverter 66A and an inverter 67A. The inverter 66A is configured to receive the first output bit signal 50A at the storage node 52A and generate a first final output bit signal 68A. The inverter 67A is configured to receive the first final output bit signal 68A and generate a first final output bit signal 68A'. The first final output bit signal 68A and the first final output bit signal 68A' are thus complementary signals that are inverted with respect to one another. The first final output bit signal 68A may be transmitted to a CLC of one of the pipeline circuits 12 (shown in FIG. 1). Due to the inversion by the inverter 66A, the final output bit state is inverted with respect to the first output bit signal 50A. When the sampling stage is opaque, the first final output bit state is isolated from changes in the first input bit state of the first input bit signal 48A. In essence, these changed cannot enter the storage node 52A and affect the first final output bit state. However, once the clock signal 20 oscillates back into the first clock state, the first slave sampling stage 44A again becomes transparent. Thus, the first input bit state of the first input bit signal 48A can change the first output bit state of the first output bit signal 50A at the storage node 52A. In this manner, valid bit states are passed according to the timing of the clock signal 20.

With regards to the second flip flop 70B(1), the flip flop 70B(1) includes a second master latch 71B that is the same as the master latch 71 shown in FIG. 3 and a second slave latch 36(1)B that is the same as the slave latch 36 shown in FIG. 3. The second master latch 71B and the second slave latch 36(1)B are operably associated so as to provide the second flip flop 70B(1). The second master latch 71B is opaque while the second slave latch 36(1)B is transparent and deraces the path to the second slave latch 36(1)B so that that hold time requirements for the second slave latch 36(1)B are more easily met. The second master latch 71B has a second master setup stage 72B that includes a second master sampling stage 73B. The second master sampling stage 73B configured to sample a second initial input bit signal 74 having a second initial input bit state to generate the second input bit signal 48B while the clock signal 20 is in the second clock state. Thus, the second master latch 71B is transparent while the second slave latch 36(1)B is opaque. To generate the second input bit signal 48B, the second master sampling stage 73B generates the second intermediary output bit signal 76B. Since a second intermediary output bit state of the second intermediary output bit signal 76B is based on the second initial input bit state, the second input bit state of the second input bit signal 48B is related to the second intermediary output bit state of the second intermediary output bit signal 76B. In this embodiment, the second master sampling stage 73B generates the second intermediary output bit signal 76B such that the second intermediary output bit state of the intermediary output bit signal 76B is inverted with respect to the second initial input bit state to generate the second input bit signal 48B.

In this example, the second master setup stage 72B includes an inverter 79B and a storage node 81B. The inverter 79B is coupled to the storage node 81B so as to generate the second input bit signal 48B from the intermediary output bit signal 76B. The second input bit state of the second input bit signal 48B is thus inverted with respect to the second intermediary output bit state of the second intermediary output bit signal 76B due to the inverter 79B.

The second master latch 71B also includes a second master feedback stage 78B. The second master setup stage 72B and the second master feedback stage 78B are operably associated so as to provide the second master latch 71B. The second master feedback stage 78B is operable to receive the second input bit signal 48B from the inverter 79B. The second master feedback stage 78B is configured to drive the second intermediary output bit state of the second intermediary output bit signal 76B at the storage node 81B such that the second intermediary output bit state of the second intermediary output bit signal 76B is held at the storage node 81B in accordance with the second input bit state of the second input bit signal 48B while the clock signal 20 is in the first clock state. In this embodiment, the second master feedback stage 78B is configured to drive the second intermediary output bit state of the second intermediary output bit signal 76B at the storage node 81B so that the second intermediary output bit state of the second intermediary output bit signal 76B is inverted with respect to the second input bit state of the second input bit signal 48B.

The second slave latch 36(1)B has a second slave setup stage 43B that includes a second slave sampling stage 44B. The second slave latch 36(1)B further includes a second slave feedback stage 46(1)B that is operably associated with the second slave setup stage 43B to provide the second slave latch 36(1)B. Both the second slave sampling stage 44B and the second slave feedback stage 46(1)B receive the clock signal 20 (as the negative side clock signal 20NB and the positive side clock signal 20PB) from the second clock path 38B.

The second slave sampling stage 44B receives a second input bit signal 48B having a second input bit state. While the clock signal 20 is in the first clock state, the second slave feedback stage 46(1)B is deactivated and the second slave setup stage 43B is activated. As such, the second slave sampling stage 44B is configured to sample a second input bit signal 48B having a second input bit state and generate a second output bit signal 50B having a second output bit state provided in accordance with the second input bit state while the clock signal is in the first clock state. Furthermore, the second slave setup stage 43B is configured to generate the second feedback input bit signal 54B having the second feedback input bit state provided in accordance with the second output bit state whereby the second feedback input bit signal 54B is feedback of the second output bit signal 50B when the clock signal 20 is in the first clock state and in the second clock state.

In one implementation, the second input bit state could be in a higher voltage state to represent a logical "1." On the other hand, the second input bits state could be in a lower voltage state to represent a logical "0." While the clock signal 20 is in the first clock state, the second slave sampling stage 44B is configured to sample the second input bit signal 48B and generate a second output bit signal 50B having a second output bit state provided in accordance with the second input bit state. In other words, the second slave latch 36(1)B is transparent while the clock signal 20 is in the first clock state. Depending on the embodiment of the second slave sampling stage 44B, the second slave sampling stage 44B may be configured to generate the second output bit signal 50B so that the second output bit state is the same as the second input bit state or inverted with respect to the second input bit state. In this example, the second output bit state is inverted with respect to the second input bit state. While the clock signal 20 is in the first clock state, the second output bit signal 50B is received at a storage node 52B with the second output bit state as provided by the second slave sampling stage 44B while the clock signal 20 is in the first clock state.

In this embodiment, the second slave setup stage 43B includes an inverter 60B. The inverter 60B generates the second feedback input bit signal 54B having a second feedback bit state that is inverted with respect to the second output bit state of the second output bit signal 50B. Accordingly, when the second output bit state of the second output bit signal 50B is a logical "1", the second feedback bit state of the second feedback input bit signal 54B is a logical "0." In contrast, when the second output bit state of the second output bit signal 50B is a logical "0," the second feedback bit state of the feedback input bit signal 54B is a logical "1." Thus, this embodiment of the second slave feedback stage 46(1)B is configured to drive the second output bit state of the second output bit signal 50B as an inverse of the second feedback input bit signal 54B, first feedback input bit signal 54A, and the third feedback input bit signal 54C.

As shown in FIG. 5, the second slave feedback stage 46(1)B is configured to generate a second feedback output bit signal 62B to drive the second output bit state of the second output bit signal 50B while the clock signal 20 is in the second clock state. In this embodiment, the while the clock signal 20 is in the second clock state and the second slave feedback stage 46(1)B is active, the second slave feedback stage 46(1)B is configured to set the second feedback output bit state in accordance with the first feedback input bit state and the third feedback input bit state in response to the first feedback input bit state of the first feedback input bit signal 54A and the third feedback input bit state of the third feedback input bit signal 54C being the same. More specifically, the second slave feedback stage 46(1)B is configured to set the second feedback output bit state of the second feedback output bit signal 62B so that the second feedback output bit state of the second output bit signal 50B is inverted with respect to the first feedback input bit state of the first feedback input bit signal 54A and the third feedback input bit state of the third feedback input bit signal 54C in response to the first feedback input bit state of the first feedback input bit signal 54A and the third feedback input bit state of the third feedback input bit signal 54C being the same. Also, to drive the second output bit state of the second output bit signal 50B while the clock signal 20 is in the second clock state, the second slave feedback stage 46(1)B is configured to hold the second feedback output bit state of the second feedback output bit signal 62B in response to the first feedback input bit state and the third feedback input bit state being different. In this manner, the second feedback output bit state of the second feedback output bit signal 62B is configured to drive the second output bit state of the second output bit signal 50B, as described above. The second feedback output bit signal 62B is provided to the two other redundant latches so that they can also provide TMR correction. As such, the second slave feedback stage 46(1)B is configured to drive the second output bit state of the second output bit signal 50B independently of the second feedback input bit state of the second feedback input bit signal 54B and without feedback for the second output bit signal 50B in order to provide TMR correction.

The feedback stage 46(1)B thus is a tristate gate that includes a second Muller C element and a second transmission gate, just like the Muller C element 90 and the transmission gate 92 shown in FIG. 4. The second Muller C element and the second transmission gate of the feedback stage 46(1)B shown in FIG. 5 operate in the same manner as the Muller C element 90 and the transmission gate 92 shown in FIG. 4 where the feedback input bit signal 54 is the second feedback input bit signal 54B, the feedback input bit signal 54(Y) is the first feedback input bit signal 54A, and the feedback input bit signal 54(Z) is the third feedback input bit signal 54C.

The second slave setup stage 43B further includes an inverter 66B and an inverter 67B. The inverter 66B is configured to receive the second output bit signal 50B at the storage node 52B and generate a second final output bit signal 68B. The inverter 67B is configured to receive the second final output bit signal 68B and generate a second final output bit signal 68B'. The second final output bit signal 68B and the second final output bit signal 68B' are thus complementary signals that are inverted with respect to one another. The second final output bit signal 68B may be transmitted to a CLC of one of the pipeline stages 12 (shown in FIG. 1). Due to the inversion by the inverter 66, the final output bit state is inverted with respect to the second output bit signal 50B. When the sampling stage is opaque, the second final output bit state is isolated from changes in the second input bit state of the second input bit signal 48B. In essence, these changed cannot enter the storage node 52B and affect the second final output bit state. However, once the clock signal 20 oscillates back into the first clock state, the second slave sampling stage 44B again becomes transparent. Thus, the second input bit state of the second input bit signal 48B can change the second output bit state of the second output bit signal 50B at the storage node 52B. In this manner, valid bit states are passed according to the timing of the clock signal 20.

With regards to the third flip flop 70C(1), the flip flop 70C(1) includes a third master latch 71C that is the same as the master latch 71 shown in FIG. 3 and a third slave latch 36(1)C that is the same as the slave latch 36 shown in FIG. 3. The third master latch 71C and the third slave latch 36(1)C are operably associated so as to provide the third flip flop 70C(1). The third master latch 71C is opaque while the third slave latch 36(1)C is transparent and decreases the path to the third slave latch 36(1)C so that that hold time requirements for the third slave latch 36(1)C are more easily met. The master latch 71 has a third master setup stage 72C that includes a third master sampling stage 73C. The third master sampling stage 73C configured to sample a third initial input bit signal 74 having a third initial input bit state to generate the third input bit signal 48C while the clock signal 20 is in the second clock state. Thus, the third master latch 71C is transparent while the third slave latch 36(1)C is opaque. To generate the third input bit signal 48C, the third master sampling stage 73C generates the third intermediary output bit signal 76C. Since a third intermediary output bit state of the third intermediary output bit signal 76C is based on the third initial input bit state, the third input bit state of the third input bit signal 48C is related to the third intermediary output bit state of the third intermediary output bit signal 76C. In this embodiment, the third master sampling stage 73C generates the third intermediary output bit signal 76C such that the third intermediary output bit state of the intermediary output bit signal 76C is inverted with respect to the third initial input bit state to generate the third input bit signal 48C.

In this example, the third master setup stage 72C includes an inverter 79C and a storage node 81C. The inverter 79C is coupled to the storage node 81C so as to generate the third input bit signal 48C from the intermediary output bit signal 76C. The third input bit state of the third input bit signal 48C is thus inverted with respect to the third intermediary output bit state of the third intermediary output bit signal 76C due to the inverter 79C.

The third master latch 71C also includes a third master feedback stage 78C. The third master setup stage 72C and the third master feedback stage 78C are operably associated so as to provide the third master latch 71C. The third master feedback stage 78C is operable to receive the third input bit signal 48C from the inverter 79C. The third master feedback stage 78C is configured to drive the third intermediary output bit state of the third intermediary output bit signal 76C at the storage node 81C such that the third intermediary output bit state of the third intermediary output bit signal 76C is held at the storage node 81C in accordance with the third input bit state of the third input bit signal 48C while the clock signal 20 is in the first clock state. In this embodiment, the third master feedback stage 78C is configured to drive the third intermediary output bit state of the third intermediary output bit signal 76C at the storage node 81C so that the third intermediary output bit state of the third intermediary output bit signal 76C is inverted with respect to the third input bit state of the third input bit signal 48C.

The third slave latch 36(1)C has a third slave setup stage 43C that includes a third slave sampling stage 44C. The third slave latch 36(1)C further includes a third slave feedback stage 46(1)C that is operably associated with the third slave setup stage 43C to provide the third slave latch 36(1)C. Both the third slave sampling stage 44C and the third slave feedback stage 46(1)C receive the clock signal 20 (as the negative side clock signal 20NC and the positive side clock signal 20PC) from the clock path 38C.

The third slave sampling stage 44C receives a third input bit signal 48C having a third input bit state. While the clock signal 20 is in the first clock state, the third slave feedback stage 46(1)C is deactivated and the third slave setup stage 43C is activated. As such, the third slave sampling stage 44C is configured to sample a third input bit signal 48C having a third input bit state and generate a third output bit signal 50C having a third output bit state provided in accordance with the third input bit state while the clock signal is in the first clock state. Furthermore, the third slave setup stage 43C is configured to generate the third feedback input bit signal 54C having the third feedback input bit state provided in accordance with the third output bit state whereby the third feedback input bit signal 54C is feedback of the third output bit signal 50C when the clock signal 20 is in the first clock state and in the second clock state.

In one implementation, the third input bit state could be in a higher voltage state to represent a logical "1." On the other hand, the third input bits state could be in a lower voltage state to represent a logical "0." While the clock signal 20 is in the first clock state, the third slave sampling stage 44C is configured to sample the third input bit signal 48C and generate a third output bit signal 50C having a third output bit state provided in accordance with the third input bit state. In other words, the third slave latch 36(1)C is transparent while the clock signal 20 is in the first clock state. Depending on the embodiment of the third slave sampling stage 44C, the third slave sampling stage 44C may be configured to generate the third output bit signal 50C so that the third output bit state is the same as the third input bit state or inverted with respect to the third input bit state. In this example, the third output bit state is inverted with respect to the third input bit state. While the clock signal 20 is in the first clock state, the third output bit signal 50C is received at a storage node 52C with the third output bit state as provided by the third slave sampling stage 44C while the clock signal 20 is in the first clock state.

In this embodiment, the third slave setup stage 43C includes an inverter 60C. The inverter 60C generates the third feedback input bit signal 54C having a third feedback bit state that is inverted with respect to the third output bit state of the third output bit signal 50C. Accordingly, when the third output bit state of the third output bit signal 50C is a logical "1", the third feedback bit state of the third feedback input bit signal 54C is a logical "0." In contrast, when the third output bit state of the third output bit signal 50C is a logical "0," the third feedback bit state of the third feedback input bit signal 54C is a logical "1." Thus, this embodiment of the third slave feedback stage 46(1)C is configured to drive the third output bit state of the third output bit signal 50C as an inverse of the third feedback input bit signal 54C, first feedback input bit signal 54A, and the second feedback input bit signal 54B.

As shown in FIG. 5, the third slave feedback stage 46(1)C is configured to generate a third feedback output bit signal 62C to drive the third output bit state of the third output bit signal 50C while the clock signal 20 is in the second clock state. In this embodiment, the while the clock signal 20 is in the second clock state and the third slave feedback stage 46(1)C is active, the third slave feedback stage 46(1)C is configured to set the third feedback output bit state in accordance with the first feedback input bit state and the second feedback input bit state in response to the first feedback input bit state of the first feedback input bit signal 54A and the second feedback input bit state of the second feedback input bit signal 54B being the same. More specifically, the third slave feedback stage 46(1)C is configured to set the third feedback output bit state of the third feedback output bit signal 62C so that the third feedback output bit state of the third output bit signal 50C is inverted with respect to the first feedback input bit state of the first feedback input bit signal 54A and the second feedback input bit state of the second feedback input bit signal 54B in response to the first feedback input bit state of the first feedback input bit signal 54A and the second feedback input bit state of the second feedback input bit signal 54B being the same. Also, to drive the third output bit state of the third output bit signal 50C while the clock signal 20 is in the second clock state, the third slave feedback stage 46(1)C is configured to hold the third feedback output bit state of the third feedback output bit signal 62C in response to the first feedback input bit state and the second feedback input bit state being different. In this manner, the third feedback output bit state of the third feedback output bit signal 62C is configured to drive the third output bit state of the third output bit signal 50C, as described above. The third feedback output bit signal 62C is provided to the two other redundant latches so that they can also provide TMR correction. As such, the third slave feedback stage 46(1)C is configured to drive the third output bit state of the third output bit signal 50C independently of the third feedback input bit state of the third feedback input bit signal 54C and without feedback for the third output bit signal 50C in order to provide TMR correction.

The feedback stage 46(1)C thus is a tristate gate that includes a third Muller C element and a third transmission gate, just like the Muller C element 90 and the transmission gate 92 shown in FIG. 4. The third Muller C element and the third transmission gate of the feedback stage 46(1)C shown in FIG. 5 operate in the same manner as the Muller C element 90 and the transmission gate 92 shown in FIG. 4 where the feedback input bit signal 54 is the third feedback input bit signal 54C, the feedback input bit signal 54(Y) is the first feedback input bit signal 54A, and the feedback input bit signal 54(Z) is the second feedback input bit signal 54B.

The third slave setup stage 43C further includes an inverter 66C and an inverter 67C. The inverter 66C is configured to receive the third output bit signal 50C at the storage node 52C and generate a third final output bit signal 68C. The inverter 67C is configured to receive the third final output bit signal 68C and generate a third final output bit signal 68C'. The third final output bit signal 68C and generate the third final output bit signal 68C' are thus complementary signals that are inverted with respect to one another. The third final output bit signal 68C may be transmitted to a CLC of one of the pipeline circuits 12 (shown in FIG. 1). Due to the inversion by the inverter 66, the final output bit state is inverted with respect to the third output bit signal 50C. When the sampling stage is opaque, the third final output bit state is isolated from changes in the third input bit state of the third input bit signal 48C. In essence, these changed cannot enter the storage node 52C and affect the third final output bit state. However, once the clock signal 20 oscillates back into the first clock state, the third slave sampling stage 44C again becomes transparent. Thus, the third input bit state of the third input bit signal 48C can change the third output bit state of the third output bit signal 50C at the storage node 52C. In this manner, valid bit states are passed according to the timing of the clock signal 20.

Referring to FIG. 3, FIG. 4, FIG. 5, and FIG. 6, FIG. 6 is a signal diagram that describes the operation of the flip flops 70A(1), 70B(1), and 70C(1) in the TMR SSE shown in FIG. 5 when providing TMR feedback correction. Accordingly, FIG. 6 also describes the operation of the flip flop 70 shown in FIG. 3 when the feedback stage 46 is provided as the feedback stage 46(1) shown in FIG. 4 when providing TMR feedback correction.

Figure 6:
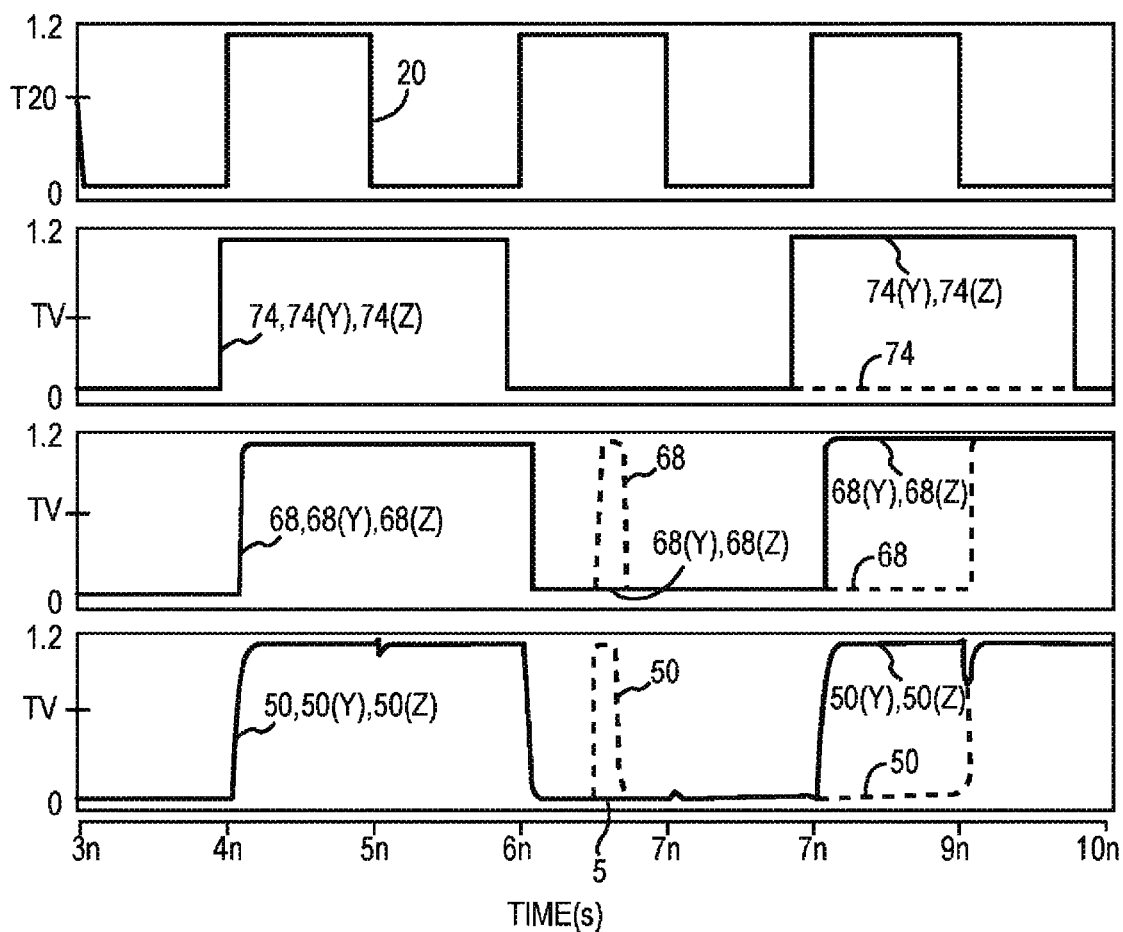
FIG. 6 is a signal diagram that illustrates TMR correction operations in the TMR SSE shown in FIG. 5.

A top illustration in FIG. 6 is an illustration of one exemplary implementation of the clock signal 20. The clock signal 20 is in the first clock state when a variable voltage of the clock signal 20 is above a threshold clock voltage level TV20 and is a second clock state when the variable voltage of the clock signal 20 is below the threshold clock voltage level TV20. The clock signal 20 is driven to approximately the supply voltage level (e.g. 1.2V) by negative to positive clock edges so that the clock signal 20 has positive clock pulses that provide the clock signal 20 clearly in the first clock state during positive clock pulses. The clock signal 20 is driven to approximately ground (e.g. 0V) by positive to negative clock edges so that the clock signal 20 has negative clock pulses that provide the clock signal 20 clearly in the second clock state.

A top intermediate illustration in FIG. 6 illustrates the initial input bit signals 74, an initial input bit signal 74(Y), an initial input bit signal 74(Z), a bottom intermediate illustration in FIG. 6 illustrates the final output bit signal 68, a final output bit signals 68(Y), a final output bit signal 68(Z). A bottom illustration in FIG. 6 illustrates the output bit signal 50, an output bit signals 50(Y), and an output bit signal 50(Z). With regards to FIG. 3, the top intermediate illustration, the bottom intermediate illustration, and the bottom illustration of FIG. 6, the initial input bit signal 74, the final output bit signal 68, and the output bit signal 50 describe the operation of the flip flop 70. Furthermore, the top intermediate illustration, the bottom intermediate illustration, and the bottom illustration of FIG. 6, the initial input bit signal 74(Y), the final output bit signal 68(Y), and the output bit signal 50(Y) describe the operation of a redundant flip flop in another SSC within the same pipeline stage 12 (shown in FIG. 1). Finally, the top intermediate illustration, the bottom intermediate illustration, and the bottom illustration of FIG. 6, the initial input bit signal 74(Z), the final output bit signal 68(Z), and the output bit signal 50(Z) describe the operation of still another redundant flip flop in yet another SSC within the same pipeline stage 12 (shown in FIG. 1).

With regards to the relationship between FIG. 5 and FIG. 6, FIG. 6 describes the operation of the TRM SSE where the flip flop 70 shown in FIG. 3 may be any one of the flip flops 70A(1), 70B(1), 70C(1), the redundant flip flop may be any one of the other two redundant flip flops 70B(1), 70C(1), 70A(1), and the yet other redundant flip flop may be the other one of the other two redundant flip flops 70C(1), 70A(1), 70B(1). Accordingly, the operations described for FIG. 6 describe the operation of the flip flops 70A(1), 70B(1), 70C(1) when the flip flop 70 is the first flip flop 70A(1), the initial input bit signal 74 is the first initial input bit signal 74A, the final output bit signal 68 is the first final output bit signal 68A, the output bit signal 50 is the first output bit signal 50A, one of the redundant flip flops is the second flip flop 70B(1), the initial input bit signal 74(Y) is the second initial input bit signal 74B, the final output bit signal 68(Y) is the second final output bit signal 68B, the output bit signal 50(Y) is the second output bit signal 50B, the other one of the redundant flip flops is the third flip flop 70C(1), the initial input bit signal 74(Z) is the third initial input bit signal 74C, the final output bit signal 68(Z) is the third final output bit signal 68C, and the output bit signal 50(Z) is the third output bit signal 50C. Also, the operations described for FIG. 6 describe the operation of the flip flops 70A(1), 70B(1), 70C(1) when the flip flop 70 is the second flip flop 70B(1), the initial input bit signal 74 is the second initial input bit signal 74B, the final output bit signal 68 is the second final output bit signal 68B, the output bit signal 50 is the second output bit signal 50B, one of the redundant flip flops is the first flip flop 70A(1), the initial input bit signal 74(Y) is the first initial input bit signal 74A, the final output bit signal 68(Y) is the first final output bit signal 68A, the output bit signal 50(Y) is the first output bit signal 50A, the other one of the redundant flip flops is the third flip flop 70C(1), the initial input bit signal 74(Z) is the third initial input bit signal 74C, the final output bit signal 68(Z) is the third final output bit signal 68C, and the output bit signal 50(Z) is the third output bit signal 50C. Finally, the operations described for FIG. 6 describe the operation of the flip flops 70A(1), 70B(1), 70C(1) when the flip flop 70 is the third flip flop 70C(1), the initial input bit signal 74 is the third initial input bit signal 74C, the final output bit signal 68 is the third final output bit signal 68C, the output bit signal 50 is the third output bit signal 50C, one of the redundant flip flops is the first flip flop 70A(1), the initial input bit signal 74(Y) is the first initial input bit signal 74A, the final output bit signal 68(Y) is the first final output bit signal 68A, the output bit signal 50(Y) is the first output bit signal 50A, the other one of the redundant flip flops is the second flip flop 70B(1), the initial input bit signal 74(Z) is the second initial input bit signal 74B, the final output bit signal 68(Z) is the second final output bit signal 68B, and the output bit signal 50(Z) is the second output bit signal 50B.

All three of the bit signals of the top intermediate illustration (i.e., the initial input bit signals 74, 74(Y), 74(Z)), the bottom intermediate illustration (i.e., the final output bit signals 68, 68(Y), 68(Z)), and the bottom illustration of FIG. 6 (i.e., the output bit signals 50, 50(Y), 50(Z)) are represented by solid lines when there are no dotted lines. However, when there are solid lines and dotted lines, the dotted lines represent the bit signals indicated while the solid lines represent the bit signal indicated. Each of the bit signals of the top intermediate illustration (i.e., the initial input bit signals 74, 74(Y), 74(Z)), the bottom intermediate illustration (i.e., the final output bit signals 68, 68(Y), 68(Z)), and the bottom illustration of FIG. 6 (i.e., the output bit signals 50, 50(Y), 50(Z)) have a bit state provided by a variable voltage of the bit signal. When the variable voltage is above a threshold voltage TV, the bit state of the bit signal is in a high bit state that represents a logical "1." When the variable voltage is below the threshold voltage TV, the bit state of the bit signal is in a low bit state that represents a logical "0."

FIG. 6 describes the operation of the three redundant flip flops when an SEU occurs in the output bit signal 50 during a second clock cycle of the clock signal 20 and a SET occurs and is captured by the master latch 71 of the flip flop during a third clock cycle of the clock signal 20. During a first clock cycle of the clock signal 20, the initial input bit state of the initial input bit signal 74, the initial input bit state of the initial input bit signal 74(Y), and the initial input bit state of the initial input bit signal 74(Z) match and in this case are in the high bit state. As such, the feedback input bit states of the feedback input bit signals 54(Y) and 54(Z) are the same and the feedback stage 46 drives the output bit state of the output bit signal 50 and the final output bit state of the final output bit signal 68(Y) 68(Z) to the high bit state. During the second clock cycle of the clock signal 20, the initial input bit state of the initial input bit signal 74, the output bit signal 50 experiences an SEU and is thus temporarily provided in the wrong bit state (temporarily provided in the high bit state). However, the output bit states of the output bit signals 50(Y), 50(Z) are correct. As such, the feedback input bit states of the feedback input bit signals 54(Y) and 54(Z) are the same and the feedback stage 46 drives the output bit state of the output bit signal 50 and the final output bit state of the final output bit signal 68(Y) 68(Z) to the low bit state, which is the correct bit state. As soon as the collected charge is dissipated by the master feedback stage 78, the correct state is restored. During the third clock cycle of the clock signal 20, the initial input bit state of the initial input bit signal 74 experiences a SET which is captured by the master latch 71 of the flip flop 70. The SET propagates to the output bit signal 50 and the final output bit signal 68 in the slave latch 36. However, when the clock signal 20 is in the second clock state during the third clock cycle, the output bit states of the output bit signals 50(Y) and 50(Z) are correct and thus the feedback stage 46 corrects the output bit state of the output bit signal 50 and the final output bit state of the final output bit signal 68. The storage node 52 of the flip flop 70 are charged or discharged dynamically by the feedback stage 46 only for the time required to restore the correct state, which is a function of the restoring current and the amount of charge that can be deposited.

Figure 7:
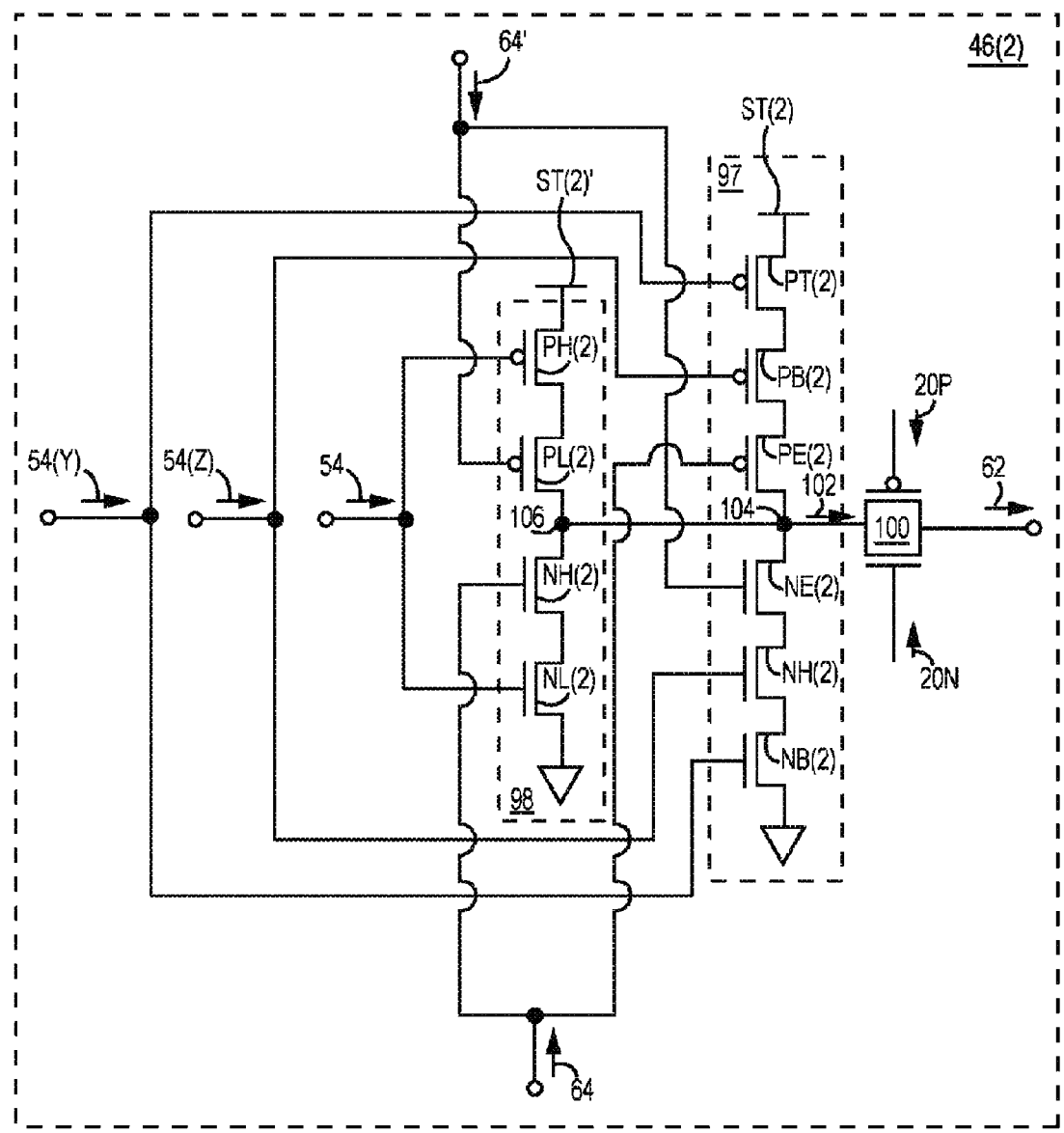
FIG. 7 illustrates another embodiment of a feedback stage for the flip flop shown in FIG. 3, where the feedback stage is operable in a TMR correction mode and in a non-redundant feedback correction mode.

FIG. 7 illustrates one embodiment of a feedback stage 46(2), which is one embodiment of the feedback stage 46 shown in FIG. 3. In this example, the feedback stage 46(2) is provided as a tristate gate. The feedback stage 46(2) is configured to generate the feedback output bit signal 62 that drives the output bit state of the output bit signal 50 in accordance with the feedback output bit state of the feedback output bit signal 62 while the clock signal is in the second clock state. The feedback output bit signal 62 drives the output bit state of the output bit signal 50 at the storage node 52 to the feedback output bit state of the feedback output bit signal 62 while the clock signal 20 is in the second clock state. However, in this embodiment, the feedback stage 46(2) is operable in a triple modular redundant feedback correction mode and in a non-redundant feedback correction mode. The feedback stage 46(2) shown in FIG. 7 is configured to receive the feedback mode signal 64 and the complementary feedback mode signal 64'. The feedback mode signal 64 and the complementary feedback mode signal 64' indicate the TMR feedback mode when a feedback mode bit state of the feedback mode signal 64 is in low and when a complementary feedback mode bit state of the complementary feedback mode signal 64' is high. In contrast, the feedback mode signal 64 and the complementary feedback mode signal 64' indicate the non-redundant feedback correction mode when the feedback mode bit state of the feedback mode signal 64 is in high and when the complementary feedback mode bit state of the complementary feedback mode signal 64' is low.

When the feedback stage 46(2) is in TMR feedback correction mode, the feedback stage 46(2) provides TMR correction in the same manner described above with respect to the feedback stage 46(1) shown in FIG. 4. Thus, when the feedback stage 46(2) is in the TMR correction mode and while the clock signal 20 is in the second clock state, the feedback stage 46(2) is configured to set the output bit state of the output bit signal 50 in accordance with the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. More specifically, when the feedback stage 46(2) is in the TMR correction mode and while the clock signal 20 is in the second clock state, the feedback stage 46(2) is configured to set the feedback output bit state of the feedback output bit signal 62 in accordance with the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. However, the feedback stage 46(2) is configured to hold the output bit state of the output bit signal 50 in response to the feedback input bit state of the feedback input bit signal 54(Y) and the feedback input bit state of the feedback input bit signal 54(Z) being the different when the feedback stage 46(2) is in the TMR feedback mode. More specifically, the feedback stage 46(2) is configured to hold the feedback output bit state of the feedback output bit signal 62 in response to the feedback input bit state of the feedback input bit signal 54(Y) and the feedback input bit state of the feedback input bit signal 54(Z) being the different when the feedback stage 46(2) is in the TMR feedback mode. The feedback stage 46(2) shown in FIG. 7 is configured to receive the feedback input bit signal 54 that provides feedback of the output bit signal 50. However, when the feedback stage 46(2) is in the TMR correction mode and while the clock signal is in the second clock state, the feedback stage 46(2) is configured to ignore the feedback input bit signal 54.

When the feedback stage 46(2) is in the non-redundant feedback correction mode and while the clock signal 20 is in the second clock state, the feedback stage 46(2) is configured to set the output bit state of the output bit signal 50 in accordance with the feedback input bit state of the feedback input bit signal 54. More specifically, when the feedback stage 46(2) is in the non-redundant feedback correction mode and while the clock signal 20 is in the second clock state, the feedback stage 46(2) is configured to set the feedback output bit state of the feedback output bit signal 62 in accordance with the feedback input bit state of the feedback input bit signal 54. Furthermore, the feedback stage 46(2) ignores the feedback input bit signal 54(Y) and the feedback input bit signal 54(Z). As such, by operating in the non-redundant feedback correction mode, each of the redundant pipeline circuits 12A, 12B, 12C shown in FIG. 1 can be operated independently.

As shown in FIG. 7, the feedback stage 46(2) has a Muller C element 97, a buffer gate 98, and a transmission gate 100. With regards to the Muller C element 97, the Muller C element 97 is operable to receive the feedback input bit signal 54(Y), the feedback input bit signal 54(Z), the feedback mode signal 64 and the complementary feedback mode signal 64'. The Muller C element 97 is disabled in the non-redundant feedback correction mode and enabled in the TMR correction mode. The Muller C element 97 is configured to generate an intermediary feedback bit signal 102 having an intermediary feedback bit state when the Muller C element is enabled. With regards to the intermediary feedback bit state of the intermediary feedback bit signal 102, the Muller C element 97 is configured hold the intermediary feedback bit state of the intermediary feedback bit signal 102 in response to the feedback input bit state of the feedback input bit signal 54(Y) and the feedback input bit state of the feedback input bit signal 54(Z) being different. Thus, the Muller C element 97 is configured to hold the feedback output bit state of the feedback output bit signal 62 in response to the feedback input bit state of the feedback input bit signal 54(Y) and the feedback input bit state of the feedback input bit signal 54(Z) being different. The Muller C element 97 is further configured to set the intermediary feedback bit state of the intermediary feedback bit signal 102 in accordance with the feedback input bit state of the feedback input bit signal 54(Y) and the feedback input bit state of the feedback input bit signal 54(Z) in response to feedback input bit state of the feedback input bit signal 54(Y) and the feedback input bit state of the feedback input bit signal 54(Z) being the same. Thus, the Muller C element 97 is further configured to set the feedback output bit state of the feedback output bit signal 62 in accordance with the feedback input bit state of the feedback input bit signal 54(Y) and the feedback input bit state of the feedback input bit signal 54(Z) in response to feedback input bit state of the feedback input bit signal 54(Y) and the feedback input bit state of the feedback input bit signal 54(Z) being the same.

In this embodiment, the Muller C element 97 is an inverting Muller C element and thus the Muller C element 97 is configured to provide the intermediary feedback bit state of the intermediary feedback bit signal 102 such that the intermediary feedback bit state of the intermediary feedback bit signal 102 is inverted with respect to the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. The Muller C element 97 includes a triplet of P channel FETs (P-channel FET PT(2), a P-channel FET PB(2), a P-channel FET PE(2)) and a triplet of N channel FETs (N-channel FET NT(2), a N-channel FET NB(2), a N-channel FET NE(2)). The triplet of P channel FETs (P-channel FET PT(2), a P-channel FET PB(2), a P-channel FET PE(2)) is stacked and coupled between a supply terminal ST(2) and a connection node 104. The triplet of N channel FETs (N-channel FET NT(2), a N-channel FET NB(2), a N-channel FET NE(2)) is stacked and coupled between the connection node 104 and ground. A gate of one of the triplet of P-channel FETs is coupled to receive the feedback input bit signal 54(Y), a gate of the another one of the triplet of P-channel FETs is coupled to receive the feedback input bit signal 54(Z), and a gate of the remaining one of the triplet of P-channel FETs is coupled to receive the feedback mode signal 64. A gate of one of the triplet of N-channel FETs is coupled to receive the feedback input bit signal 54(Y), a gate of the another one of the triplet of N-channel FETs is coupled to receive the feedback input bit signal 54(Z), and a gate of the remaining one of the triplet of N-channel FETs is coupled to receive the complementary feedback mode signal 64'.

Accordingly, one of the triplet of P-channel FETs is enabled in response to the feedback mode signal 64 indicating the TMR correction mode and one of the triplet of N-channel FETs is enabled in response to the complementary feedback mode signal 64' indicating the TMR correction mode. However, one of the triplet of P-channel FETs is disabled and one of the triplet of N-channel FETs is disabled in response to the feedback input bit state of the feedback input bit signal 54(Y) and the feedback input bit state of the feedback input bit signal 54(Z) being different. As such, charge from the supply terminal ST(2) is blocked and the charge is prevented from flowing to ground at the connection node 104. Consequently, the intermediary feedback bit state of the intermediary feedback bit signal 102 is held at the connection node 104 and does not change. The two of P-channel FETs are enabled and the two of the N-channel FETs are disabled in response to the feedback input bit state of the feedback input bit signal 54(Y) and the feedback input bit state of the feedback input bit signal 54(Z) being low. Since the feedback mode signal 64 enabled the remaining P-channel FET, the triplet of P-channel FETs are all enabled. As such, the triplet of P-channel FETs pull the intermediary feedback bit state of the intermediary feedback bit signal 102 high at the connection node 104. In contrast, the two of P-channel FETs are disabled and the two of N-channel FETs are enabled in response to the feedback input bit state of the feedback input bit signal 54(Y) and the feedback input bit state of the feedback input bit signal 54(Z) being high. Since the complementary feedback mode signal 64' enabled the remaining N-channel FET, the triplet of N-channel FETs are all enabled. As such, the pair of N-channel FETs push the intermediary feedback bit state of the intermediary feedback bit signal 102 low at the connection node 104. Accordingly, when the feedback mode signal 64 and the complementary feedback mode signal 64' indicate the TMR correction mode, the Muller C element 97 is responsive to the feedback input bit signal 54(Y) and the feedback input bit state of the feedback input bit signal 54(Z) and thus the Muller C element 97 is enabled. When enabled in the TMR correction mode, the Muller C element 97 operates in the same manner as the Muller C element 90 shown in FIG. 4.

Referring again to FIG. 7, one of the triplet of P-channel FETs is disabled in response to the feedback mode signal 64 indicating the non-redundant feedback correction mode and one of the triplet of N-channel FETs is disabled in response to the complementary feedback mode signal 64' indicating the non-redundant feedback correction mode. In this case, the Muller C element 97 is unresponsive to the feedback input bit state of the feedback input bit signal 54(Y) and the feedback input bit state of the feedback input bit signal 54(Z). More specifically, regardless of the feedback input bit state of the feedback input bit signal 54(Y) and the feedback input bit state of the feedback input bit signal 54(Z), the Muller C element 97 blocks charge from the supply terminal ST(2) and prevents charge from flowing to ground at the connection node 104. As such, the Muller C element 97 is disabled in the non-redundant feedback correction mode.

With regards to the buffer gate 98, the buffer gate 98 is operable to receive the feedback input bit signal 54, the feedback mode signal 64 and the complementary feedback mode signal 64'. The buffer gate 98 is also configured to generate the intermediary feedback bit signal 94 having the intermediary feedback bit state when the buffer gate 98 is enabled in the non-redundant feedback correction mode. With regards to the intermediary feedback bit state of the intermediary feedback bit signal 94, the buffer gate 98 is configured to set the intermediary feedback bit state of the intermediary feedback bit signal in accordance with the feedback input bit state of the feedback input bit signal 54 when the buffer gate 98 is enabled. Thus, the buffer gate 98 is configured to set the feedback output bit state of the feedback output bit signal 62 in accordance with the feedback input bit state of the feedback input bit signal 54 when the buffer gate 98 is enabled.

In this embodiment, the buffer gate 98 is an inverting buffer gate and thus the buffer gate 98 is configured to provide the intermediary feedback bit state of the intermediary feedback bit signal 102 such that the intermediary feedback bit state of the intermediary feedback bit signal 102 is inverted with respect to the feedback input bit state of the feedback input bit signal 54(Y) and the feedback input bit state of the feedback input bit signal 54(Z) in response to the feedback input bit state of the feedback input bit signal 54(Y) and the feedback input bit state of the feedback input bit signal 54(Z) being the same. The buffer gate 98 includes a pair of P-channel FETs (P-channel FET PH(2), a P-channel FET PL(2)) and a pair of N channel FETs (N-channel FET NH(2), a N-channel FET NL(2)). The pair of P-channel FETs (P-channel FET PH(2), a P-channel FET PL(2)) is stacked and coupled between a supply terminal ST(2)' and a connection node 106. The pair of N-channel FETs (N-channel FET NH(2), a N-channel FET NL(2)) is stacked and coupled between the connection node 106 and ground. A gate of one of the pair of P-channel FETs is coupled to receive the feedback input bit signal 54 while a gate of the other one of the pair of P-channel FETs is coupled to receive the complementary feedback mode signal 64'. Also, a gate of one of the pair of N-channel FETs is coupled to receive the feedback input bit signal 54 while a gate of the other one of the pair of N-channel FETs is coupled to receive the feedback mode signal 64. The connection node 106 is directly connected to the connection node 104

Accordingly, one of the pair of P-channel FETs is enabled and one of the pair of N-channel FETs is enabled in response to the feedback mode signal 64 and the complementary feedback mode signal 64' indicating the non-redundant feedback correction mode. The other one of the pair of P-channel FETs is enabled and the other one of the pair of N-channel FETs is disabled in response to the feedback input bit state of the feedback input bit signal 54 being low. Accordingly, the pair of P-channel FETs is enabled in response to the feedback input bit state of the feedback input bit signal 54 being low. Thus, the intermediary feedback bit state of the intermediary feedback bit signal 102 is pulled high by the pair of the N-channel FETs. However, the other one of the pair of P-channel FETs is disabled and the other one of the pair of N-channel FETs is enabled in response to the feedback input bit state of the feedback input bit signal 54 being high. Accordingly, the pair of N-channel FETs is enabled in response to the feedback input bit state of the feedback input bit signal 54 being high. Thus, the intermediary feedback bit state of the intermediary feedback bit signal 102 is pulled low by the pair of the N channel FETs. In this manner, the buffer gate 98 is configured to set the feedback output bit state of the feedback output bit signal 62 in accordance with the feedback input bit state of the feedback input bit signal 54.

In this embodiment, when the feedback mode signal 64 and the complementary feedback mode signal 64' indicate the non-redundant feedback correction mode, the buffer gate 98 is responsive to the feedback input bit signal 54 and is thus enabled. However, when the feedback mode signal 64 and the complementary feedback mode signal 64' indicate the TMR correction mode, one of the pair of P-channel FETs is disabled and one of the pair of N-channel FETs is disabled. As such, the buffer gate 98 blocks charge from the supply terminal ST(2)' and the charge is prevented from flowing to ground at the connection node 106. Accordingly, the buffer gate 98 is unresponsive to the feedback input bit signal 54 and the buffer gate 98 is thus disabled.

The transmission gate 100 is operable to receive the intermediary feedback bit signal 102 from the connection node 104 of the Muller C element 97 or from the connection node 106 of the buffer gate 98, since their selects are complementary. Furthermore, the transmission gate 100 is configured to receive the positive side clock signal 20P and the negative side clock signal 20N. The transmission gate 100 is configured to generate the feedback output bit signal 62 that drives the output bit state of the feedback output bit signal 62 (shown FIG. 2) and sample the intermediary feedback bit signal 102 while the clock signal 20 is in the second clock state (i.e., while the positive side clock signal 20P is in the second clock state and the negative side clock signal 20N is in the first clock state). As such, while the clock signal 20 is in the second clock state (i.e., while the positive side clock signal 20P is in the second clock state and the negative side clock signal 20N is in the first clock state), the transmission gate 100 is configured to sample the intermediary feedback bit signal 102 so that the feedback output bit state of the feedback output bit signal 62 is set in accordance with the intermediary feedback bit state of the intermediary feedback bit signal 102. In this example, the transmission gate 100 provides the feedback output bit state of the feedback output bit signal 62 to be the same as the intermediary feedback bit stage of the intermediary feedback bit signal 102 while transparent. The transmission gate 100 is deactivated and does not generate the feedback output bit signal 62 while the clock signal 20 is in the first clock state (i.e., while the positive side clock signal 20P is in the first clock state and the negative side clock signal 20N is in the second clock state).

Figure 8:
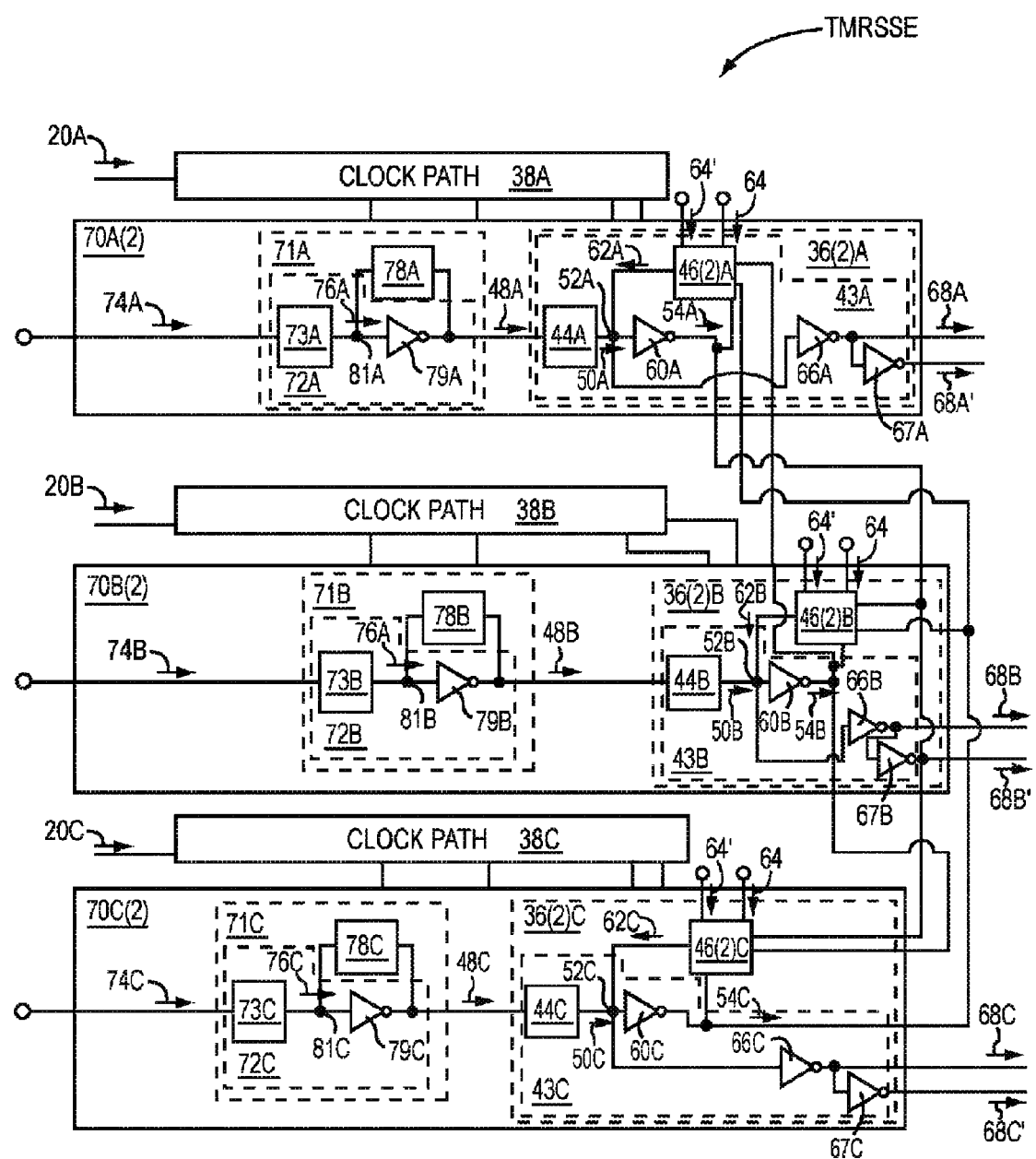
FIG. 8 illustrates another embodiment of a TMR SSE having three redundant copies of the flip flop shown in FIG. 3, where each of the slave latches in the three redundant flip flops have a copy of the feedback stage shown in FIG. 7.

FIG. 8 illustrates another TMR SSE. In this embodiment, the TMR SSE includes a first flip flop 70A(2), a second flip flop 70B(2), and a third flip flop 70C(2). With regards to the first flip flop 70A(2), the first flip flop 70A(2) shown in FIG. 8 is an embodiment of the first flip flop 70A(2) shown in FIG. 3. The first flip flop 70A(2) shown in FIG. 8 includes the same first master latch 71A as the first flip flop 70A(1) shown in FIG. 5 and a first slave latch 36(2)A. The first clock path 38A is the same one described above with respect to FIG. 5. The first slave latch 36(2)A includes the same first slave setup stage 43A as the first slave latch 36(1)A shown in FIG. 5. The first slave latch 36(2)A includes the same first slave setup stage 43A as the first slave latch 36(1)A shown in FIG. 5. However, the first slave latch 36(2)A includes a first feedback stage 46(2)A that is identical to the feedback stage 46(2) shown in FIG. 7. Thus, the first slave feedback stage 46(2)A includes a first Muller C element that is identical to the Muller C element 97 shown in FIG. 7, a first buffer gate that is identical to the buffer gate 98 shown in FIG. 7, and a first transmission gate that is identical to the transmission gate 100 shown in FIG. 7. The first feedback stage 46(2)A is configured to receive the first feedback input bit signal 54A as the feedback input bit signal 54 in FIG. 7, the second feedback input bit signal 54B from the second flip flop 70B as the feedback input bit signal 54(Y) in FIG. 7, the third feedback input bit signal 54C from the third flip flop 70C as the feedback input bit signal 54(Z) in FIG. 7, the feedback mode signal 64, and the complementary feedback mode signal 64'. As such, the first slave feedback stage 46(2)A of the first flip flop 70A(2) is operable in the TMR correction mode and in the non-redundant feedback correction mode.

The first clock path 38A, the first master latch 71A and the first slave setup stage 43A of the first flip flop 70A(2) operate in the same manner as described above with to the respect the first flip flop 70A(1) shown in FIG. 5 and thus do not need to be discussed any further. Furthermore, while the clock signal 20 is in the second clock state and when the first flip flop 70A(2) operates in the TMR correction mode, the first slave feedback stage 46(2)A of the first slave latch 36(2)A provides TMR correction in the same manner as the first slave feedback stage 46(1)A of the first slave latch 36(1)A described with respect to FIG. 2, FIG. 3, FIG. 5, and FIG. 6. Thus the operation of the first slave feedback stage 46(2)A while the clock signal 20 is in the second clock state and when the first flip flop 70A(2) operates in the TMR correction mode does not need to be discussed further. The first slave feedback stage 46(2)A ignores and is unresponsive to the first feedback input bit signal 54A in the TMR correction mode.

However, as described above for the feedback stage 46(2) shown in FIG. 7, the first slave feedback stage 46(2)A also operates in the non-redundant feedback correction mode in response to the feedback mode signal 64 and the complementary feedback mode signal 64' indicating the non-redundant feedback correction mode. More specifically, while the clock signal 20 is in the second clock state, the first slave feedback stage 46(2)A is configured to generate the first slave feedback output bit signal 62A to drive the first output bit state of the first output bit signal 50A. However, when the first slave feedback stage 46(2)A is in the non-redundant feedback correction mode and while the clock signal 20 is in the second clock state, the first slave feedback stage 46(2)A is configured to set the first slave feedback output bit state of the first slave feedback output bit signal 62A in accordance with the first feedback input bit state of the first feedback input bit signal 54A. Accordingly, the first slave feedback stage 46(2)A is configured to set the first output bit state of the first output bit signal 54A in accordance with the first feedback input bit state of the first feedback input bit signal 54A when the first slave feedback stage 46(2)A is in the non-redundant feedback correction mode. Accordingly, the first slave feedback stage 46(2)A ignores and is unresponsive to the second feedback input bit signal 54B from the second flip flop 70B and ignores and is unresponsive to the third feedback input bit signal 54C from the third flip flop 70C.

With regards to the second flip flop 70B(2), the second flip flop 70B(2) shown in FIG. 8 is an embodiment of the second flip flop 70B(2) shown in FIG. 3. The second flip flop 70B(2) shown in FIG. 8 includes the same second master latch 71B as the second flip flop 70B(1) shown in FIG. 5 and a second slave latch 36(2)B. The second clock path 38B is the same one described above with respect to FIG. 5. The second slave latch 36(2)B includes the same second slave setup stage 43B as the second slave latch 36(1)B shown in FIG. 5. The second slave latch 36(2)B includes the same second slave setup stage 43B as the second slave latch 36(1)B shown in FIG. 5. However, the second slave latch 36(2)B includes a second feedback stage 46(2)B that is identical to the feedback stage 46(2) shown in FIG. 7. Thus, the second slave feedback stage 46(2)B includes a second Muller C element that is identical to the Muller C element 97 shown in FIG. 7, a second buffer gate that is identical to the buffer gate 98 shown in FIG. 7, and a second transmission gate that is identical to the transmission gate 100 shown in FIG. 7. The second feedback stage 46(2)B is configured to receive the second feedback input bit signal 54B as the feedback input bit signal 54 in FIG. 7, the first feedback input bit signal 54A from the first flip flop 70A as the feedback input bit signal 54(Y) in FIG. 7, the third feedback input bit signal 54C from the third flip flop 70C as the feedback input bit signal 54(Z) in FIG. 7, the feedback mode signal 64, and the complementary feedback mode signal 64'. As such, the second slave feedback stage 46(2)B of the second flip flop 70B(2) is operable in the TMR correction mode and in the non-redundant feedback correction mode.

The second clock path 38B, the second master latch 71B and the second slave setup stage 43B of the second flip flop 70B(2) operate in the same manner as described above with to the respect the second flip flop 70B shown in FIG. 5 and thus do not need to be discussed any further. Furthermore, while the clock signal 20 is in the second clock state and when the second flip flop 70B(2) operates in the TMR correction mode, the second slave feedback stage 46(2)B of the second slave latch 36(2)B provides TMR correction in the same manner as the second slave feedback stage 46(1)B of the second slave latch 36(1)B described with respect to FIG. 2, FIG. 3, FIG. 5, and FIG. 6. Thus the operation of the second slave feedback stage 46(2)B while the clock signal 20 is in the second clock state and when the second flip flop 70B(2) operates in the TMR correction mode does not need to be discussed further. The second slave feedback stage 46(2)B ignores and is unresponsive to the second feedback input bit signal 54B in the TMR correction mode.

However, as described above for the feedback stage 46(2) shown in FIG. 7, the second slave feedback stage 46(2)B also operates in the non-redundant feedback correction mode in response to the feedback mode signal 64 and the complementary feedback mode signal 64' indicating the non-redundant feedback correction mode. More specifically, while the clock signal 20 is in the second clock state, the second slave feedback stage 46(2)B is configured to generate the second slave feedback output bit signal 62B to drive the second output bit state of the second output bit signal 50B. However, when the second slave feedback stage 46(2)B is in the non-redundant feedback correction mode and while the clock signal 20 is in the second clock state, the second slave feedback stage 46(2)B is configured to set the second slave feedback output bit state of the second slave feedback output bit signal 62B in accordance with the second feedback input bit state of the second feedback input bit signal 54B. Accordingly, the second slave feedback stage 46(2)B is configured to set the second output bit state of the second output bit signal 54B in accordance with the second feedback input bit state of the second feedback input bit signal 54B when the second slave feedback stage 46(2)B is in the non-redundant feedback correction mode. Accordingly, the second slave feedback stage 46(2)B ignores and is unresponsive to the first feedback input bit signal 54A from the first flip flop 70A and ignores and is unresponsive to the third feedback input bit signal 54C from the third flip flop 70C.

With regards to the third flip flop 70C(2), the third flip flop 70C(2) shown in FIG. 8 is an embodiment of the third flip flop 70C(2) shown in FIG. 3. The third flip flop 70C(2) shown in FIG. 8 includes the same third master latch 71C as the third flip flop 70C(1) shown in FIG. 5 and a third slave latch 36(2)C. The third clock path 38C is the same one described above with respect to FIG. 5. The third slave latch 36(2)C includes the same third slave setup stage 43C as the third slave latch 36(1)C shown in FIG. 5. The third slave latch 36(2)C includes the same third slave setup stage 43C as the third slave latch 36(1)C shown in FIG. 5. However, the third slave latch 36(2)C includes a third feedback stage 46(2)C that is identical to the feedback stage 46(2) shown in FIG. 7. Thus, the third slave feedback stage 46(2)C includes a third Muller C element that is identical to the Muller C element 97 shown in FIG. 7, a third buffer gate that is identical to the buffer gate 98 shown in FIG. 7, and a third transmission gate that is identical to the transmission gate 100 shown in FIG. 7. The third feedback stage 46(2)C is configured to receive the third feedback input bit signal 54C as the feedback input bit signal 54 in FIG. 7, the first feedback input bit signal 54A from the first flip flop 70A as the feedback input bit signal 54(Y) in FIG. 7, the second feedback input bit signal 54B from the second flip flop 70B as the feedback input bit signal 54(Z) in FIG. 7, the feedback mode signal 64, and the complementary feedback mode signal 64'. As such, the third slave feedback stage 46(2)C of the third flip flop 70C(2) is operable in the TMR correction mode and in the non-redundant feedback correction mode.

The clock path 38C, the third master latch 71C and the third slave setup stage 43C of the third flip flop 70C(2) operate in the same manner as described above with to the respect the third flip flop 70C(1) shown in FIG. 5 and thus do not need to be discussed any further. Furthermore, while the clock signal 20 is in the second clock state and when the third flip flop 70C(2) operates in the TMR correction mode, the third slave feedback stage 46(2)C of the third slave latch 36(2)C provides TMR correction in the same manner as the third slave feedback stage 46(1)C of the third slave latch 36(1)C described with respect to FIG. 2, FIG. 3, FIG. 5, and FIG. 6. Thus the operation of the third slave feedback stage 46(2)C while the clock signal 20 is in the second clock state and when the third flip flop 70C(2) operates in the TMR correction mode does not need to be discussed further. The third slave feedback stage 46(2)C ignores and is unresponsive to the third feedback input bit signal 54C in the TMR correction mode.

However, as described above for the feedback stage 46(2) shown in FIG. 7, the third slave feedback stage 46(2)C also operates in the non-redundant feedback correction mode in response to the feedback mode signal 64 and the complementary feedback mode signal 64' indicating the non-redundant feedback correction mode. More specifically, while the clock signal 20 is in the second clock state, the third slave feedback stage 46(2)C is configured to generate the third slave feedback output bit signal 62C to drive the third output bit state of the third output bit signal 50C. However, when the third slave feedback stage 46(2)C is in the non-redundant feedback correction mode and while the clock signal 20 is in the second clock state, the third slave feedback stage 46(2)C is configured to set the third slave feedback output bit state of the third slave feedback output bit signal 62C in accordance with the third feedback input bit state of the third feedback input bit signal 54C. Accordingly, the third slave feedback stage 46(2)C is configured to set the third output bit state of the third output bit signal 54C in accordance with the third feedback input bit state of the third feedback input bit signal 54C when the third slave feedback stage 46(2)C is in the non-redundant feedback correction mode. Accordingly, the third slave feedback stage 46(2)C ignores and is unresponsive to the first feedback input bit signal 54A from the first flip flop 70A and ignores and is unresponsive to the second feedback input bit signal 54B from the second flip flop 70B.

As shown in FIG. 8, the third slave feedback stage 46(2)C is configured to generate a third feedback output bit signal 62C to drive the third output bit state of the third output bit signal 50C while the clock signal 20 is in the second clock state. In this embodiment, the while the clock signal 20 is in the second clock state and the third slave feedback stage 46(2)C is active, the third slave feedback stage 46(2)C is configured to set the third feedback output bit state in accordance with the first feedback input bit state and the second feedback input bit state in response to the first feedback input bit state of the first feedback input bit signal 54A and the second feedback input bit state of the second feedback input bit signal 54B being the same. More specifically, the third slave feedback stage 46(2)C is configured to set the third feedback output bit state of the third feedback output bit signal 62C so that the third feedback output bit state of the third output bit signal 50C is inverted with respect to the first feedback input bit state of the first feedback input bit signal 54A and the second feedback input bit state of the second feedback input bit signal 54B in response to the first feedback input bit state of the first feedback input bit signal 54A and the second feedback input bit state of the second feedback input bit signal 54B being the same. Also, to drive the third output bit state of the third output bit signal 50C while the clock signal 20 is in the second clock state, the third slave feedback stage 46(2)C is configured to hold the third feedback output bit state of the third feedback output bit signal 62C in response to the first feedback input bit state and the second feedback input bit state being different. In this manner, the third feedback output bit state of the third feedback output bit signal 62C is configured to drive the third output bit state of the third output bit signal 50C, as described above. The third feedback output bit signal 62C is provided to the two other redundant latches so that they can also provide TMR correction. As such, the third slave feedback stage 46(2)C is configured to drive the third output bit state of the third output bit signal 50C independently of the third feedback input bit state of the third feedback input bit signal 54C and without feedback for the third output bit signal 50C in order to provide TMR correction.

Figure 9:
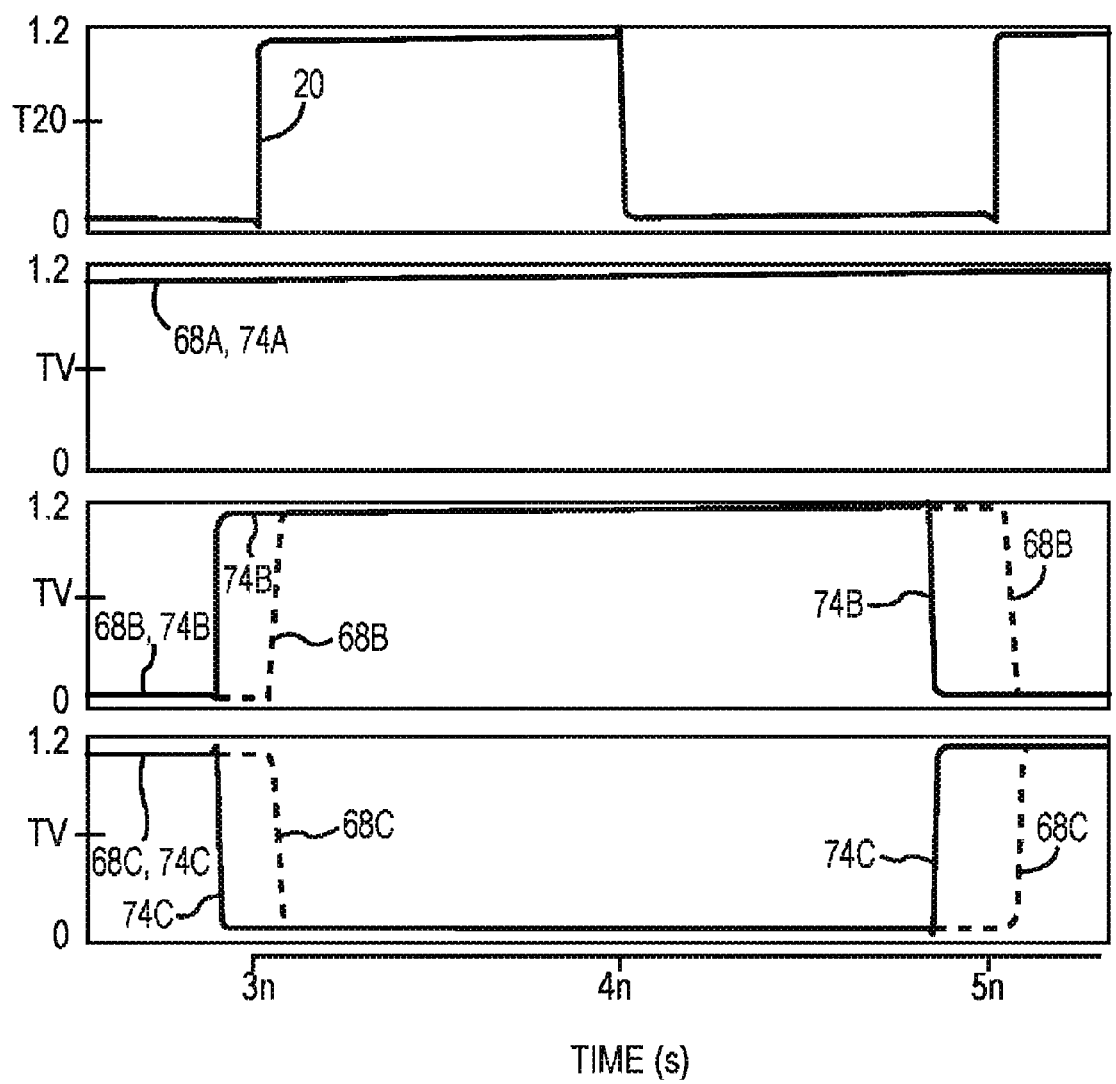
FIG. 9 illustrates one type of operation where the three flip flops in the TMR SSE shown in FIG. 8 are operating independently during the non-redundant feedback correction mode.

Referring to FIG. 3, FIG. 7, FIG. 8, and FIG. 9, FIG. 9 is a signal diagram that describes one type of the operation of the flip flops 70A(2), 70B(2), and 70C(2) in the TMR SSE shown in FIG. 8 while the slave feedback stages 46(2)A, 46(2)B, and 46(2)C are each in the non-redundant feedback correction mode. A top illustration in FIG. 9 is an illustration of one exemplary implementation of the clock signal 20. The clock signal 20 is in the first clock state when a variable voltage of the clock signal 20 is above a threshold clock voltage level TV20 and is an second clock state when the variable voltage of the clock signal 20 is below the threshold clock voltage level TV20. The clock signal 20 is driven to approximately the supply voltage level (e.g. 1.2V) by negative to positive clock edges so that the clock signal 20 has positive clock pulses that provide the clock signal 20 clearly in the first clock state during positive clock pulses. The clock signal 20 is driven to approximately ground (e.g. 0V) by positive to negative clock edges so that the clock signal 20 has negative clock pulses that provide the clock signal 20 clearly in the second clock state.

A top intermediate illustration in FIG. 9 illustrates the first initial input bit signals 74A and the first final output bit signal 68A. A bottom intermediate illustration in FIG. 9 illustrates the second initial input bit signals 74B and the second final output bit signal 68B. A bottom illustration in FIG. 9 illustrates the third initial input bit signals 74C and the third final output bit signal 68C.

All three of the bit signals of the top intermediate illustration (i.e., the first initial input bit signals 74A and the first final output bit signal 68A), the bottom intermediate illustration (i.e., the second initial input bit signals 74B and the second final output bit signal 68B), and the bottom illustration of FIG. 9 (i.e., the third initial input bit signals 74C and the third final output bit signal 68C) are represented by solid lines when there are no dotted lines. However, when there are solid lines and dotted lines, the dotted line represents the final output bit signals 68A, 68B, 68C while the solid lines continue to represent the initial input bit signals 74A, 74B, 74C. Each of the bit signals of the top intermediate illustration (i.e., the first initial input bit signals 74A and the first final output bit signal 68A), the bottom intermediate illustration (i.e., the second initial input bit signals 74B and the second final output bit signal 68B), and the bottom illustration of FIG. 9 (i.e., the third initial input bit signals 74C and the third final output bit signal 68C) have a bit state provided by a variable voltage of the bit signal. When the variable voltage is above a threshold voltage TV, the bit state of the bit signal is in a high bit state that represents a logical "1." When the variable voltage is below the threshold voltage TV, the bit state of the bit signal is in a low bit state that represents a logical "0." As shown by FIG. 6, the bits states are independent of one another since all three redundant pipeline circuits 12A, 12B, 12C are operating independently.

Figure 10:
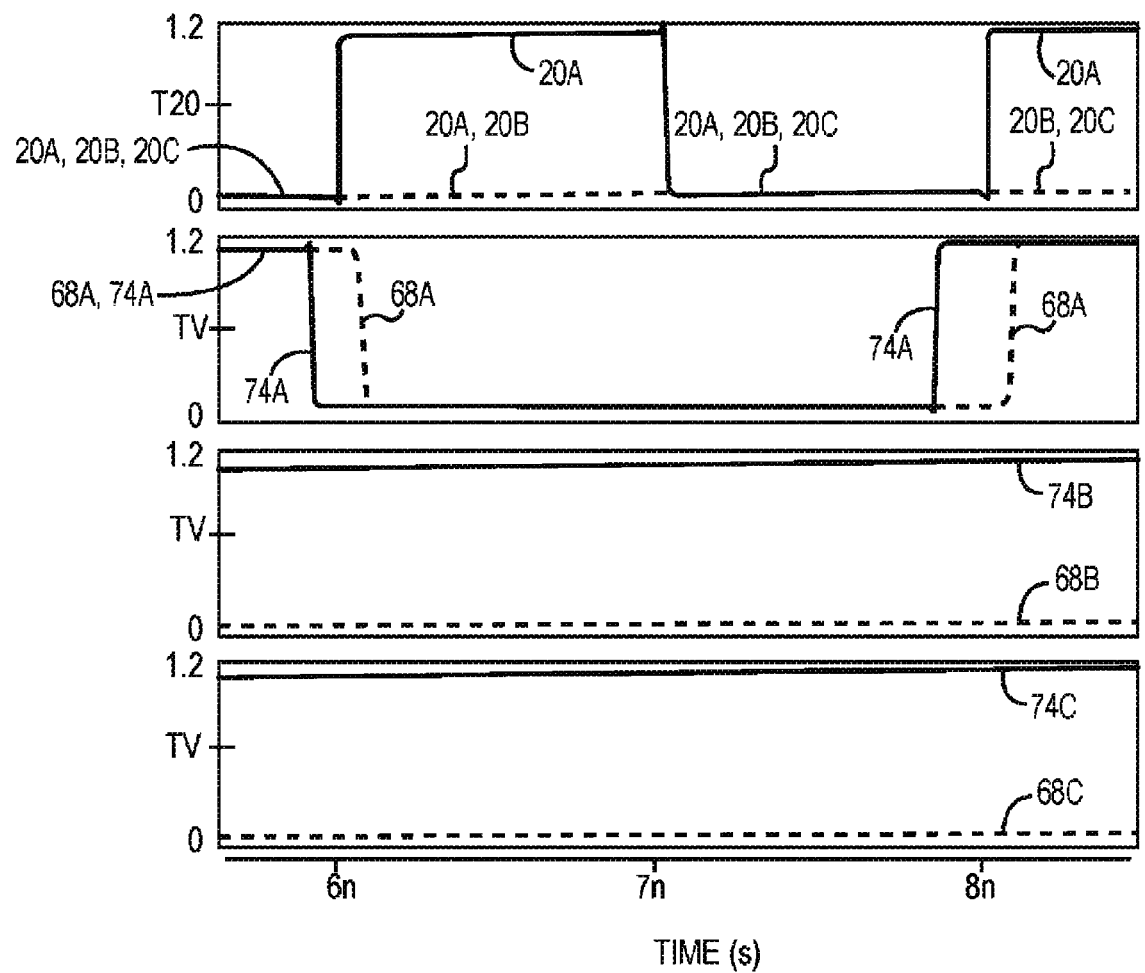
FIG. 10 is a signal diagram that illustrates another type of operation where one of the flip flops shown in FIG. 8 is operating independently while the other two flip flops are disabled during the non-redundant feedback correction mode.

Referring to FIG. 3, FIG. 7, FIG. 8, and FIG. 10, FIG. 10 is a signal diagram that describes another type of the operation of the flip flops 70A(2), 70B(2), and 70C(2) in the TMR SSE shown in FIG. 8 while the slave feedback stages 46(2)A, 46(2)B, and 46(2)C are each in the non-redundant feedback correction mode. A top illustration in FIG. 10 is an illustration of one exemplary implementation of the clock signal 20A, the clock signal 20B, and the clock signal 20C. In this example, only the clock 20A is provided as the clock signal 20. The clock signal 20B and the clock signal 20C are maintained at ground in order to disable the flip flops 70A(2), 70B(2), and 70C(2). The clock signal 20 is in the first clock state when a variable voltage of the clock signal 20 is above a threshold clock voltage level TV20 and is an second clock state when the variable voltage of the clock signal 20 is below the threshold clock voltage level TV20. The clock signal 20 is driven to approximately the supply voltage level (e.g. 1.2V) by negative to positive clock edges so that the clock signal 20 has positive clock pulses that provide the clock signal 20 clearly in the first clock state during positive clock pulses. The clock signal 20 is driven to approximately ground (e.g. 0V) by positive to negative clock edges so that the clock signal 20 has negative clock pulses that provide the clock signal 20 clearly in the second clock state. All of the clock signals 20A, 20B, 20C of the top intermediate illustration are represented as a solid line when there are no dotted lines. When there are dotted lines, the dotted lines represent the clock signals 20B, 20C, while the solid lines continue to represent the clock signal 20A.

A top intermediate illustration in FIG. 10 illustrates the first initial input bit signals 74A and the first final output bit signal 68A. A bottom intermediate illustration in FIG. 10 illustrates the second initial input bit signals 74B and the second final output bit signal 68B. A bottom illustration in FIG. 10 illustrates the third initial input bit signals 74C and the third final output bit signal 68C.

All of the bit signals of the top intermediate illustration (i.e., the first initial input bit signals 74A and the first final output bit signal 68A), the bottom intermediate illustration (i.e., the second initial input bit signals 74B and the second final output bit signal 68B), and the bottom illustration of FIG. 10 (i.e., the third initial input bit signals 74C and the third final output bit signal 68C) are represented by solid lines when there are no dotted lines. However, when there are solid lines and dotted lines, the dotted line represents the final output bit signals 68A, 68B, 68C while the solid lines continue to represent the initial input bit signals 74A, 74B, 74C. Each of the bit signals of the top intermediate illustration (i.e., the first initial input bit signals 74A and the first final output bit signal 68A), the bottom intermediate illustration (i.e., the second initial input bit signals 74B and the second final output bit signal 68B), and the bottom illustration of FIG. 10 (i.e., the third initial input bit signals 74C and the third final output bit signal 68C) have a bit state provided by a variable voltage of the bit signal. When the variable voltage is above a threshold voltage TV, the bit state of the bit signal is in a high bit state that represents a logical "1." When the variable voltage is below the threshold voltage TV, the bit state of the bit signal is in a low bit state that represents a logical "0." As shown by FIG. 6, the only the first initial input bit state and only the first final output bit state are changing since the redundant pipeline circuit 12A is operating while the pipeline circuits 12B, 12C are disabled.

Those skilled in the art will recognize improvements and modifications to the preferred embodiments of the present disclosure. All such improvements and modifications are considered within the scope of the concepts disclosed herein and the claims that follow.

What is claimed is:

1. A sequential state element (SSE) comprising:
    a first setup stage configured to sample a first input bit signal having a first input bit state, generate a first output bit signal having a first output bit state provided in accordance with the first input bit state while a clock signal is in a first clock state, and generate a first feedback input bit signal having a first feedback input bit state provided in accordance with the first output bit state whereby the first feedback input bit signal provides feedback of the first output bit signal; and
    a first feedback stage is operable to receive a second feedback input bit signal having a second feedback input bit state and receive a third feedback input bit signal having a third feedback input bit state, wherein the first feedback stage is configured to drive the first output bit state of the first output bit signal while the clock signal is in a second clock state by being configured to hold the first output bit state in response to the second feedback input bit state and the third feedback input bit state being different, and set the first output bit state in accordance with the second feedback input bit state and the third feedback input bit state in response to the second feedback input bit state and the third feedback input bit state being the same.

2. The SSE of claim 1 wherein the first feedback stage is further configured to drive the first output bit state independently of the first feedback input bit state.

3. The SSE of claim 1 wherein the first feedback stage is configured to drive the first output bit state without feedback for the first output bit signal.

4. The SSE of claim 1 comprising a first flip flop that comprises a first master latch and a first slave latch wherein:
    the first master latch and the first slave latch are operably associated so as to provide the first flip flop;
    the first slave latch comprises the first setup stage and the first feedback stage, wherein the first setup stage and the first feedback stage are operably associated so that the first setup stage is a first slave setup stage of the first slave latch and so that the first feedback stage is a first slave feedback stage of the first slave latch; and
    the first master latch comprises a first master setup stage and a first master feedback stage operably associated so as to provide the first master latch.

5. The SSE of claim 4 wherein:
the first master setup stage is configured to sample a first initial input bit signal having a first initial input bit state and generate a first intermediary output bit signal having a first intermediary output bit state based on the first initial input bit state while the clock signal is in the second clock state, wherein the first input bit state of the first input bit signal is related to the first intermediary output bit state of the first intermediary output bit signal; and
the first master feedback stage is configured to drive the first intermediary output bit state of the first intermediary output bit signal such that the first intermediary output bit state is held as provided from the first master setup stage while the clock signal is in the first clock state.

6. The SSE of claim 1 wherein the first feedback stage comprises a first tristate gate configured to generate a first feedback output bit signal that drives the first output bit state in accordance with a first feedback output bit state of the first feedback output bit signal while the clock signal is in the second clock state, wherein the first tristate gate is configured to hold the first feedback output bit state in response to the second feedback input bit state and the third feedback input bit state being different, and set the first feedback output bit state in accordance with the second feedback input bit state and the third feedback input bit state in response to the second feedback input bit state and the third feedback input bit state being the same.

7. The SSE of claim 6 wherein the first tristate gate comprises:
a first Muller C element operable to receive the second feedback input bit signal and the third feedback input bit signal wherein the first Muller C element is configured to generate a first intermediary feedback bit signal having a first intermediary feedback bit state, hold the first intermediary feedback bit state in response to the second feedback input bit state and the third feedback input bit state being different, and set the first intermediary feedback bit state in accordance with the second feedback input bit state and the third feedback input bit state in response to the second feedback input bit state and the third feedback input bit state being the same; and
a first transmission gate operable to receive the first intermediary feedback bit signal from the first Muller C element, wherein the first transmission gate is configured to generate the first feedback output bit signal that drives the first output bit state and sample the first intermediary feedback bit state while the clock signal is in the second clock state so that the first feedback output bit state is set in accordance with the first intermediary feedback bit state of the first intermediary feedback bit signal.

8. The SSE of claim 1 wherein the first feedback stage is not connected to receive the first feedback input bit signal.

9. The SSE of claim 1 further comprising:
a second setup stage configured to sample a second input bit signal having a second input bit state, generate a second output bit signal having a second output bit state provided in accordance with the second input bit state while the clock signal is in the first clock state, and generate the second feedback input bit signal having the second feedback input bit state provided in accordance with the second output bit state whereby the second feedback input bit signal provides feedback of the second output bit signal; and
a third setup stage configured to sample a third input bit signal having a third input bit state, generate a third output bit signal having a third output bit state provided in accordance with the third input bit state while the clock signal is in the first clock state, and generate the third feedback input bit signal having the third feedback input bit state provided in accordance with the third output bit state whereby the third feedback input bit signal provides feedback of the third output bit signal.

10. The SSE of claim 9 further comprising:
a second feedback stage is operable to receive the first feedback input bit signal having a first feedback input bit state and receive the third feedback input bit signal having a third feedback input bit state, wherein the second feedback stage is configured to drive the second output bit state of the second output bit signal while the clock signal is in the second clock state by being configured to hold the second output bit state in response to the first feedback input bit state and the third feedback input bit state being different, and set the second output bit state in accordance with the first feedback input bit state and the third feedback input bit state in response to the first feedback input bit state and the third feedback input bit state being the same; and
a third feedback stage is operable to receive the first feedback input bit signal having a first feedback input bit state and receive the second feedback input bit signal having a second feedback input bit state, wherein the third feedback stage is configured to drive the third output bit state of the third output bit signal while the clock signal is in the second clock state by being configured to hold the third output bit state in response to the first feedback input bit state and the second feedback input bit state being different, and set the third output bit state in accordance with the first feedback input bit state and the second feedback input bit state in response to the first feedback input bit state and the second feedback input bit state being the same.

11. The SSE of claim 10 comprising a first flip flop, a second flip flop, and a third flip flop that are operably associated so that the SSE is a triple modular redundant flip flop wherein:
the first flip flop comprises a first master latch and a first slave latch;
the first master latch and the first slave latch are operably associated so as to provide the first flip flop;
the first slave latch comprises the first setup stage and the first feedback stage, wherein the first setup stage and the first feedback stage are operably associated so that the first setup stage is a first slave setup stage of the first slave latch and so that the first feedback stage is a first slave feedback stage of the first slave latch;
the first master latch comprises a first master setup stage and a first master feedback stage operably associated so as to provide the first master latch;
the second flip flop that comprises a second master latch and a second slave latch;
the second master latch and the second slave latch are operably associated so as to provide the second flip flop;
the second slave latch comprises the second setup stage and a second feedback stage, wherein the second setup stage and the second feedback stage are operably associated so that the second setup stage is a second slave setup stage of the second slave latch and so that the second feedback stage is a second slave feedback stage of the second slave latch;

the second master latch comprises a second master setup stage and a second master feedback stage operably associated so as to provide the second master latch;

the third flip flop that comprises a third master latch and a third slave latch;

the third master latch and the third slave latch are operably associated so as to provide the third flip flop;

the third slave latch comprises the third setup stage and the third feedback stage, wherein the third setup stage and the third feedback stage are operably associated so that the third setup stage is a third slave setup stage of the third slave latch and so that the third feedback stage is a third slave feedback stage of the third slave latch; and the third master latch comprises a third master setup stage and a third master feedback stage operably associated so as to provide the third master latch.

12. The SSE of claim 11 wherein:

the first master setup stage is configured to sample a first initial input bit signal having a first initial input bit state and generate a first intermediary output bit signal having a first intermediary output bit state based on the first initial input bit state while the clock signal is in the second clock state, wherein the first input bit state of the first input bit signal is related to the first intermediary output bit state of the first intermediary output bit signal;

the first master feedback stage is configured to drive the first intermediary output bit state of the first intermediary output bit signal such that the first intermediary output bit state is held as provided from the first master setup stage while the clock signal is in the first clock state;

the second master setup stage is configured to sample a second initial input bit signal having a second initial input bit state and generate a second intermediary output bit signal having a second intermediary output bit state based on the second initial input bit state while the clock signal is in the second clock state, wherein the second input bit state of the second input bit signal is related to the second intermediary output bit state of the second intermediary output bit signal;

the second master feedback stage is configured to drive the second intermediary output bit state of the second intermediary output bit signal such that the second intermediary output bit state is held as provided from the second master setup stage while the clock signal is in the first clock state;

the third master setup stage is configured to sample a third initial input bit signal having a third initial input bit state and generate a third intermediary output bit signal having a third intermediary output bit state based on the third initial input bit state while the clock signal is in the second clock state, wherein the third input bit state of the third input bit signal is related to the third intermediary output bit state of the third intermediary output bit signal; and the third master feedback stage is configured to drive the third intermediary output bit state of the third intermediary output bit signal such that the third intermediary output bit state is held as provided from the third master setup stage while the clock signal is in the first clock state.

13. The SSE of claim 10 wherein:

the first feedback stage comprises a first Muller C element and a first transmission gate;

the first Muller C element is operable to receive the second feedback input bit signal and the third feedback input bit signal wherein the first Muller C element is configured to generate a first intermediary feedback bit signal having a first intermediary feedback bit state, hold the first intermediary feedback bit state in response to the second feedback input bit state and the third feedback input bit state being different, and set the first intermediary feedback bit state in accordance with the second feedback input bit state and the third feedback input bit state in response to the second feedback input bit state and the third feedback input bit state being the same;

a first transmission gate is operable to receive the first intermediary feedback bit signal from the first Muller C element, wherein the first transmission gate is configured to generate a first feedback output bit signal that drives the first output bit state and sample the first intermediary feedback bit signal while the clock signal is in the second clock state so that a first feedback output bit state of the first feedback output bit signal is set in accordance with the first intermediary feedback bit state of the first intermediary feedback bit signal;

the second feedback stage comprises a second Muller C element and a second transmission gate;

the second Muller C element operable to receive the first feedback input bit signal and the third feedback input bit signal wherein the second Muller C element is configured to generate a second intermediary feedback bit signal having a second intermediary feedback bit state, hold the second intermediary feedback bit state in response to the first feedback input bit state and the third feedback input bit state being different, and set the second intermediary feedback bit state in accordance with the first feedback input bit state and the third feedback input bit state in response to the first feedback input bit state and the third feedback input bit state being the same;

the second transmission gate operable to receive the second intermediary feedback bit signal from the second Muller C element, wherein the second transmission gate is configured to generate a second feedback output bit signal that drives the second output bit state and sample the second intermediary feedback bit while the clock signal is in the second clock state so that a second feedback output bit state of the second feedback output bit signal is set in accordance with the second intermediary feedback bit state of the second intermediary feedback bit signal;

the third feedback stage comprises a third Muller C element and a third transmission gate;

a third Muller C element operable to receive the first feedback input bit signal and the second feedback input bit signal wherein the third Muller C element is configured to generate a third intermediary feedback bit signal having a third intermediary feedback bit state, hold the third intermediary feedback bit state in response to the first feedback input bit state and the second feedback input bit state being different, and set the third intermediary feedback bit state in accordance with the first feedback input bit state and the second feedback input bit state in response to the first feedback input bit state and the second feedback input bit state being the same; and a third transmission gate operable to receive the third intermediary feedback bit signal from the third Muller C element, wherein the third transmission gate is configured to generate a third feedback output bit signal that drives the third output bit state and sample the third intermediary feedback bit while the clock signal is in the second clock state so that a third feedback output bit state of the third feedback output bit signal is set in accordance with the third intermediary feedback bit state of the third intermediary feedback bit signal.

14. The SSE of claim 1 wherein the first feedback stage is operable to receive the first feedback input bit signal and is operable in a triple modular redundant feedback correction mode and in a non-redundant feedback correction mode wherein the first feedback stage is configured to drive the first output bit state of the first output bit signal while the clock signal is in the second clock state by being configured to hold the first output bit state in response to the second feedback input bit state and the third feedback input bit state being different when the first feedback stage is in the triple modular redundant feedback correction mode and set the first output bit state in accordance with the second feedback input bit state and the third feedback input bit state in response to the second feedback input bit state and the third feedback input bit state being the same when the first feedback stage is in the triple modular redundant feedback correction mode and the first feedback stage is further configured to drive the first output bit state of the first output bit signal while the clock signal is in the second clock state by being configured to ignore the first feedback input bit signal when the first feedback stage is in the triple modular redundant feedback correction mode.

15. The SSE of claim 14 wherein the first feedback stage is further configured to drive the first output bit state of the first output bit signal while the clock signal is in the second clock state by being configured to:
ignore the second feedback input bit signal and the third feedback input bit signal when the first feedback stage is in the non-redundant feedback correction mode; and
set the first output bit state in accordance with the first feedback input bit state of the first feedback input bit signal when the first feedback stage is in the non-redundant feedback correction mode.

16. The SSE of claim 15 wherein the first feedback stage comprises:
a first Mueller C element operable to receive the second feedback input bit signal and the third feedback input bit signal and is operable to be activated in the triple modular redundant feedback correction mode and deactivated during the non-redundant feedback correction mode, wherein, when the first Muller C element is activated, the first Muller C element is configured to generate a first intermediary feedback bit signal having a first intermediary feedback bit state, hold the first intermediary feedback bit state in response to the second feedback input bit state and the third feedback input bit state being different, and set the first intermediary feedback bit state in accordance with the second feedback input bit state and the third feedback input bit state in response to the second feedback input bit state and the third feedback input bit state being the same;
a first buffer gate operable to receive the first feedback input bit signal and operable to be activated in the non-redundant feedback correction mode and deactivated in the triple modular redundant feedback correction mode, wherein when the first buffer gate is activated, the first buffer gate is configured to generate the first intermediary feedback bit signal having the first intermediary feedback bit state and set the first intermediary feedback bit state in accordance with the first feedback bit state when the first feedback stage is in the non-redundant feedback correction mode; and
a first transmission gate operable to receive the first intermediary feedback bit signal from the first Muller C element and the first buffer gate, wherein the first transmission gate is configured to generate the first feedback output bit signal that drives the first output bit state and sample the first intermediary feedback bit while the clock signal is in the second clock state so that the first feedback output bit state is set in accordance with the first intermediary feedback bit state of the first intermediary feedback bit signal.

17. The SSE of claim 16 wherein the first Mueller C element is unresponsive to the first feedback input bit signal and the first buffer gate is unresponsive to the the second feedback input bit signal and the third feedback input bit signal such that the first feedback stage is configured to ignore the first feedback input bit signal when the first feedback stage is in the triple modular redundant feedback correction mode since the first Mueller C element is activated and the first buffer gate is deactivated and the first feedback stage is configured to ignore the second feedback input bit signal and the third feedback input bit signal when the first feedback stage is in the non-redundant feedback correction mode since the first Mueller C element is deactivated and the first buffer gate is activated.

18. The SSE of claim 13 further comprising:
a second setup stage configured to sample a second input bit signal having a second input bit state, generate a second output bit signal having a second output bit state provided in accordance with the second input bit state while the clock signal is in the first clock state, and generate the second feedback input bit signal having the second feedback input bit state provided in accordance with the second output bit state whereby the second feedback input bit signal provides feedback of the second output bit signal; and
a third setup stage configured to sample a third input bit signal having a third input bit state, generate a third output bit signal having a third output bit state provided in accordance with the third input bit state while the clock signal is in the first clock state, and generate the third feedback input bit signal having the third feedback input bit state provided in accordance with the third output bit state whereby the third feedback input bit signal provides feedback of the third output bit signal.

19. The SSE of claim 18 further comprising:
a second feedback stage is operable to receive the first feedback input bit signal, the second feedback input bit signal, and the third feedback input bit signal and is operable in the triple modular redundant feedback correction mode and in the non-redundant feedback correction mode; and
a third feedback stage is operable to receive the first feedback input bit signal, the second feedback input bit signal, and the third feedback input bit signal and is operable in the triple modular redundant feedback correction mode and in the non-redundant feedback correction mode.

20. The SSE of claim 19 further comprising:
a second feedback stage is configured to drive the second output bit state of the second output bit signal while the clock signal is in the second clock state by being configured to:
  ignore the second feedback input bit signal when the second feedback stage is in the triple modular redundant feedback correction mode;
  hold the second output bit state in response to the first feedback input bit state and the third feedback input bit state being different when the second feedback stage is in the triple modular redundant feedback correction mode;
  set the second output bit state in accordance with the first feedback input bit state and the third feedback input bit state in response to the first feedback input bit state and the third feedback input bit state being the same when the second feedback stage is in the triple modular redundant feedback correction mode;
  ignore the first feedback input bit signal and the third feedback input bit signal when the second feedback stage is in the non-redundant feedback correction mode;
  set the second output bit state in accordance with the second feedback input bit state of the second feedback input bit signal when the second feedback stage is in the non-redundant feedback correction mode; and
a third feedback stage is configured to drive the third output bit state of the third output bit signal while the clock signal is in the second clock state by being configured to:
  ignore the third feedback input bit signal when the third feedback stage is in the triple modular redundant feedback correction mode;
  hold the third output bit state in response to the first feedback input bit state and the second feedback input bit state being different when the third feedback stage is in the triple modular redundant feedback correction mode;
  set the third output bit state in accordance with the first feedback input bit state and the second feedback input bit state in response to the first feedback input bit state and the second feedback input bit state being the same when the third feedback stage is in the triple modular redundant feedback correction mode;
  ignore the first feedback input bit signal and the second feedback input signal when the third feedback stage is in the independent feedback correction mode; and
  set the third output bit state in accordance with the third feedback input bit state of the third feedback input bit signal when the third feedback stage is in the non-redundant feedback correction mode.

21. The SSE of claim 20 comprising a first flip flop, a second flip flop, and a third flip flop that are operably associated so that the SSE is a triple modular redundant flip flop wherein:
  the first flip flop comprises a first master latch and a first slave latch wherein:
    the first master latch and the first slave latch are operably associated so as to provide the first flip flop;
    the first slave latch comprises the first setup stage and the first feedback stage, wherein the first setup stage and the first feedback stage are operably associated so that the first setup stage is a first slave setup stage of the first slave latch and so that the first feedback stage is a first slave feedback stage of the first slave latch;
    the first master latch comprises a first master setup stage and a first master feedback stage operably associated so as to provide the first master latch; and
  the second flip flop that comprises a second master latch and a second slave latch wherein:
    the second master latch and the second slave latch are operably associated so as to provide the second flip flop;
    the second slave latch comprises the second setup stage and the second feedback stage, wherein the second setup stage and the second feedback stage are operably associated so that the second setup stage is a second slave setup stage of the second slave latch and so that the second feedback stage is a second slave feedback stage of the second slave latch;
    the second master latch comprises a second master setup stage and a second master feedback stage operably associated so as to provide the second master latch; and
  the third flip flop that comprises a third master latch and a third slave latch wherein:
    the third master latch and the third slave latch are operably associated so as to provide the third flip flop;
    the third slave latch comprises the third setup stage and the third feedback stage, wherein the third setup stage and the third feedback stage are operably associated so that the third setup stage is a third slave setup stage of the third slave latch and so that the third feedback stage is a third slave feedback stage of the third slave latch; and
    the third master latch comprises a third master setup stage and a third master feedback stage operably associated so as to provide the third master latch.

* * * * *